(12) United States Patent
Salus et al.

(10) Patent No.: US 12,504,775 B2
(45) Date of Patent: Dec. 23, 2025

(54) CONFIGURABLE MULTI-DOMAIN MULTI-PHASE DISAGGREGATED VOLTAGE REGULATOR

(71) Applicant: INTEL CORPORATION, Santa Clara, CA (US)

(72) Inventors: Tamir Salus, Zichron Taakov (IL); Christopher Schaef, Hillsboro, OR (US); Alex Lyakhov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 908 days.

(21) Appl. No.: 17/386,912

(22) Filed: Jul. 28, 2021

(65) Prior Publication Data

US 2023/0031911 A1 Feb. 2, 2023

(51) Int. Cl.
*G05F 1/56* (2006.01)
*H02M 3/158* (2006.01)

(52) U.S. Cl.
CPC .............. *G05F 1/56* (2013.01); *H02M 3/158* (2013.01)

(58) Field of Classification Search
CPC ..... H02M 3/1582; H02M 3/158; G05F 1/562; G05F 1/561; G05F 1/56
See application file for complete search history.

(56) References Cited

U.S. PATENT DOCUMENTS

| | | | |
|---|---|---|---|
| 7,064,530 B2 | 6/2006 | Vogman | |
| 7,646,108 B2 | 1/2010 | Paillet et al. | |
| 8,618,788 B2 | 12/2013 | Trivedi et al. | |
| 9,154,026 B2 | 10/2015 | Schrom et al. | |
| 9,787,188 B2 | 10/2017 | Uan-Zo-li et al. | |
| 9,983,661 B2 | 5/2018 | Kumar et al. | |
| 10,184,961 B2 | 1/2019 | Schrom et al. | |
| 10,761,580 B2 | 9/2020 | Suryanarayanan et al. | |
| 2019/0121411 A1* | 4/2019 | Suryanarayanan | G06F 30/00 |
| 2020/0006239 A1 | 1/2020 | Zhang et al. | |
| 2022/0247315 A1* | 8/2022 | Ren | H02J 1/14 |

* cited by examiner

*Primary Examiner* — Patrick C Chen
(74) *Attorney, Agent, or Firm* — Akona IP PC

(57) ABSTRACT

A microelectronic assembly is disclosed, comprising a first integrated circuit (IC) die having electrical load circuits, first control circuits, and a second control circuit, a second IC die having powertrain (PTR) phase circuits electrically coupled to the first IC die, and inductors in a package substrate electrically coupled to the first IC die and the second IC die within a package. Individual ones of the first control circuits regulates power to a corresponding one of the electrical load circuits. The second control circuit maps the first control circuits and the PTR phase circuits. The PTR phase circuits control power to the inductors. The first control circuits, the second control circuit, the PTR phase circuits and the inductors together function as a voltage regulator configured to receive power from the package substrate at a first voltage and deliver power to the electrical load circuits at a second voltage.

20 Claims, 11 Drawing Sheets

CONFIGURABLE MULTI-DOMAIN MULTI-PHASE DISAGGREGATED VOLTAGE REGULATOR

TECHNICAL FIELD

The present disclosure relates to techniques, methods, and apparatus directed to a configurable multi-domain multi-phase disaggregated voltage regulator.

BACKGROUND

Electronic circuits when fabricated on a wafer of semiconductor material, such as silicon, are commonly called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system. Components of such ICs operate at specific power ratings, voltages and/or currents. In many ICs, while current consumption is dynamic and depends on the load, the voltage is fixed and ideally constant for proper functioning of the components. The fixed voltage may be maintained with a voltage regulator (VR). Linear VRs are transistor-based devices usually packaged as, or along with, ICs that use differential amplifiers to control output voltage against a reference voltage, typically with input current comparable to the output current. Switching VRs toggle a series device on/off at high frequency, varying the duty cycle of voltage transferred as output. Their common topologies are buck (output voltage lower than input voltage), boost (output voltage higher than input voltage), and buck-boost. In an example of a typical computer, the VR converts 12V or 5V or 3.3V direct current (DC) from a power supply unit into lower operating voltages, such as 0.8V, 1V or 1.2V, of the IC.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
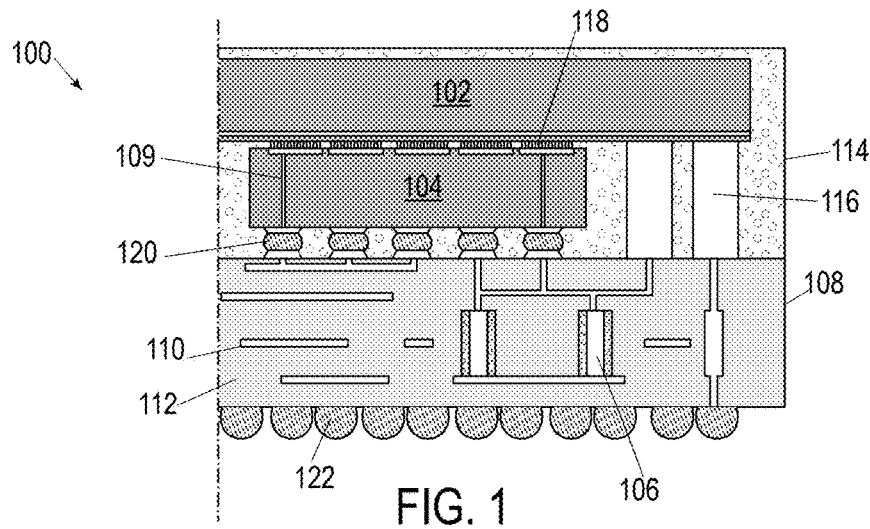
FIG. 1 is a simplified cross-sectional view of an example VR packaging architecture, according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in a way that limits the broad scope of the present disclosure and its potential applications.

In a general sense, a basic VR circuit-essentially, a single-phase VR circuit-implemented as a buck converter comprises a power supply (e.g., battery) that delivers power at a high voltage (e.g., 12V) to a metal-oxide semiconductor field effect transistor (MOSFET) switch. The switch is connected to an electrical load operating at a low voltage (e.g., 1.2V) with an intermediate inductor that acts as a choke. It may be noted that the term "electrical load" as used herein refers to a portion of an IC that consumes electrical energy, for example, a processor such as a central processing unit (CPU). When the switch is closed, the voltage on an input side of the inductor closer to the power supply becomes 12V but the voltage at the output side of the inductor connected to the electrical load does not change instantaneously. Instead, the inductor resists the change in current, building up a magnetic field, which creates a voltage drop at its output. When the switch is opened, the voltage at the input to the inductor drops to 0V. The inductor's magnetic field that was built up during charging starts to collapse, generating current at its output, which is fed to the electrical load. By opening and closing the switch appropriately, for example, by a suitable controller using pulse width modulation (PWM), the voltage at the output of the inductor connected to the electrical load can be maintained at an average of around 1.2V.

In some ICs, a multi-phase VR is used. The multi-phase VR works like the single-phase VR described above but uses multiple such circuits in parallel, with each phase handling a portion of the total current needed by the electrical load.

As used herein, the term "phase" or "phase circuit" refers to a stage, segment, or portion of a VR circuit comprising switches, inductors, capacitors, and other elements necessary and as described above to convert electrical power from a first voltage to a second voltage. Each phase is slightly offset such that at any given time, only a single phase is charging its inductor, while the remaining phases are discharging. By overlapping the phases at an offset, the combined output of the phases will average 1.2V, but as one phase starts dropping in voltage, the next phase takes over, resulting in a stable average output voltage with tighter voltage tolerance. Since the total amount of current fed to the electrical load remains more or less unchanged compared to a single-phase VR, the total current is distributed among the multiple phases, putting less strain on any of the individual circuits. Further, the increased number of phases also alleviates overall noise in the circuit from the opening and closing of the switches. It may be noted that the above description briefly explains basic VR circuitry, whereas actual implementation in ICs will include many more components such as capacitors, diodes, feedback circuits, analog to digital converters (ADCs) and digital to analog converters (DACs).

According to the market trend of servers, cloud computing, artificial intelligence (AI) and graphics, there is increasing demand for processors such as CPUs requiring high power and power density to fuel ever-increasing computing demands. To support such power consuming devices (e.g., consuming greater than 1000 W), a high input voltage (e.g., input voltage greater than 2.0V) integrated VR (IVR) packaged together with a CPU die may be used, for example, in a last power delivery stage. Such IVRs may be implemented in fully integrated form (Fully Integrated Voltage Regulator or FIVR), which is a buck converter VR integrated on the CPU die itself. However, the FIVR strategy inherently suffers from specific technical limitations that prevent scaling up CPU computing and power capabilities to the level demanded by market trends.

Latest and future silicon process (e.g., manufacturing) technologies are increasingly tuned for improving and accelerating digital performance, for example, with shrinking device sizes, decreasing transistor voltages and added metal layers. However, this trend is inherently opposite to desired optimal process properties, such as high voltage, low resistance, and low cost, for an efficient power delivery circuit (also called power delivery intellectual property (IP)) including IVRs. Because FIVRs are located on the CPU die, they necessarily use the same technology process node as the CPU die, which is typically an advanced process node that does not support efficient power delivery IPs. This creates several fundamental obstacles for keeping up with the rapid power scaling up demands of current and future CPUS.

In addition, the use of advanced digital process nodes forces a choice between lowering the input voltage to the FIVR and creating more exotic and complex FIVR powertrain (PTR) topologies, such as a multi-stacked silicon architecture. In addition, small device sizes and high metal layer count in the semiconductor die can increase process leakage and resistance, which increase FIVR losses and reduce FIVR power efficiency. Moreover, because the latest process nodes are typically costlier than older manufacturing technologies, the floor plan area of the die is typically targeted to be utilized for performance increase, for example, with a higher number of processing cores per die. Locating FIVR on this same die defeats the performance targets because it occupies costly floor plan area (e.g., 10% on advanced server products), which could otherwise go to locate processing cores, while operating inefficiently. In addition, manufacturing FIVRs using the advanced processing nodes leads to a costlier FIVR. Indeed, the high variety of recent and future CPU process nodes requires manufacturing FIVR on all of these disparate nodes, although its architecture is exactly the same, thereby creating design overhead (e.g., mainly for analog and secure digital (SD)) and validation/quality risks (e.g., re-validate every process node separately).

In one aspect of the present disclosure, an example of a multi-domain multi-phase VR packaging architecture includes a first IC die comprising electrical load circuits, and a second IC die comprising multiple PTR phases coupled to the first IC die. The PTR phases comprise high-voltage drive and/or power stages of a VR that regulates (e.g., controls) power supply to the electrical load circuits. The first IC die further comprises domain controllers (DCUs) regulating corresponding electrical load circuits, and a PTR die controller (XCU) that interfaces between the multiple PTR phases and the DCUs, for example, mapping the PTR phases and the DCUs.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are stated in the description below and the accompanying drawings.

In the following detailed description, various aspects of the illustrative implementations may be described using terms commonly employed by those skilled in the art to convey the substance of their work to others skilled in the art. For example, the term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices. The term "circuit" and "circuitry" mean one or more passive and/or active components that are arranged to cooperate with one another to provide a desired function. As used herein, these terms also refer to analog circuitry, digital circuitry, hard wired circuitry, programmable circuitry, microcontroller circuitry and/or any other type of physical hardware electrical and/or electronic component. The term "interconnect" may be used to describe any element formed of an electrically conductive material for providing electrical connectivity to one or more components associated with an IC or/and between various such components. In general, the "interconnect" may refer to both conductive traces (also sometimes referred to as "lines") and conductive vias. In general, in context of interconnects, the term "conductive trace" may be used to describe an electrically conductive element isolated by an insulating material (e.g., a low-k dielectric material) that is provided within the plane of a die. Such traces are typically stacked into several levels, or several layers, of metallization stacks. On the other hand, the term "via" may be used to describe an electrically conductive element that interconnects two or more traces at different levels. To that end, a via may be provided substantially perpendicularly to the plane of a die and may interconnect two traces in adjacent levels or two traces in not adjacent levels. A term "metallization stack" may be used to refer to a stack of one or more interconnects for providing connectivity to different circuit components of a die. Sometimes, traces and vias may be referred to as "conductive traces" and "conductive vias", respectively, to highlight the fact that these elements include electrically conductive materials such as metals.

Interconnects as described herein, in particular interconnects of the IC structures as described herein, may be used for providing electrical connectivity to one or more components associated with an IC or/and between various such components, where, in various embodiments, components associated with an IC may include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer. In another example, the terms "package" and "IC package" are synonymous, as are the terms "die" and "IC die," the term "insulating" means "electrically insulating," the term "conducting" means "electrically conducting," unless otherwise specified.

In yet another example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide.

The terms "substantially," "close," "approximately," "near," and "about," generally refer to being within +/−20% of a target value (e.g., within +/−5 or 10% of a target value) based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers. In addition, the term "dispose" as used herein refers to position, location, placement, and/or arrangement rather than to any particular method of formation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. When used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments. Further, the structures shown in the figures may take any suitable form or shape according to material properties, fabrication processes, and operating conditions.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1 is a schematic cross-sectional illustration of a portion of a microelectronic assembly 100, according to some embodiments of the present disclosure. An example embodiment comprises a VR providing power at a low voltage to one or more load domains in a load-die 102. The VR comprises one or more DCUs (domain controllers) and a XCU (PTR die controller) on load-die 102, multiple PTR phases on a PTR die (XPT) 104 and inductors 106 in a package substrate 108. In some embodiments, XPT 104 may comprise through-substrate vias (TSVs) 109; in other embodiments, XPT 104 may not comprise any TSVs. Package substrate 108 comprises conductive pathways 110 in an insulating (e.g., dielectric) material 112. Load-die 102 and XPT 104 may be encased in a mold compound 114, through which copper pillars 116 electrically couple load-die 102 with package substrate 108. In some embodiments, mold compound 114, along with XPT 104 and copper pillars 106 may comprise a discrete component, such as an interposer. Die-to-die (DTD) interconnects 118 electrically and mechanically couple load-die 102 with XPT 104. Die-to-package substrate (DTPS) interconnects 120 electrically and mechanically couple XPT 104 with package substrate 108. Interconnects 122 provide electrical and mechanical coupling of package substrate 108 to other components, such as printed circuit boards, in a system.

The DCUs comprise feedback control to regulate output voltage and send feedback signals, such as PWM signals or analog voltage, to PTR phases in XPT 104 through the XCU in load-die 102. The XCU may connect to multiple DCUs and map the DCUs to PTR phases arbitrarily based on digital configuration. Mapping also applies to communication of analog and digital signals (e.g., telemetry) from PTR phases to DCUs, for example, for current sensing, fault detection, and other such functions. PTR phases from multiple PTR dies (e.g., multiple ones of XPT 104) can be configured (e.g., ganged) to serve the same load domain in some embodiments. In such embodiments, DCUs can be connected directly to share current information and achieve load balancing between PTR phases.

PTR phases on XPT 104 can be supplied power from different input voltage sources if they supply different load domains, whereas the PTR phases regulating the same load domain may be supplied power from the same input voltage source. DCUs and XCUs may have high-bandwidth (BW) and/or high pin count interface with other die components (e.g., power management) in load-die 102 for bidirectional communication of voltage set points, controller settings, phase enablement, telemetry information, etc. In some embodiments, interconnects 118 may comprise a low pin count interface. In various embodiments, configuration and status readout of XPT 104 may be through dedicated industry standard communication interface (e.g., I2C) mastering by the XCU in load-die 102. Input voltage to PTR phases in XPT 104 may be higher than supply voltages to load-die 102 in many embodiments.

In some embodiments, load-die 102 is coupled on one side of XPT 104 which is attached to package substrate 108 on an opposite side. While the embodiment shown in FIG. 1 shows XPT 104 stacked underneath load-die 102, other embodiments may comprise planar configurations in which XPT 104 may be located side-by-side with load-die 102 and interconnected through package substrate 108, for example, with a bridge die or other interconnects as discussed in subsequent figures. Signal connections are through suitable interconnects (e.g., 118, 120), copper pillars 116 in mold compound 114, and TSVs 109 in XPT 104. Power connection from XPT 104 to inductors 106 may be through DTPS interconnects 120. Power connection from inductors 106 to load-die 102 may be through dedicated power bridges that either feed through TSVs 109 in XPT 104 or through copper pillars 116 in mold compound 114.

Various embodiments as described herein may provide many advantages. For example, PTR phases in XPT 104 may be supplied with high voltage whereas load domains in load-die 102 may be supplied entirely with low input voltage. Further, power train phases in XPT 104 decoupled from the load domains in load-die 102 may permit increasing the input voltage to XPT 104 to higher levels than would be permitted for load-die 102, thereby allowing the VR distributed between load-die 102 and XPT 104 to supply higher current to the load domains in load-die 102 at lower voltage. In another advantage, a processing technology that enables power delivery, high voltage and low resistance may be chosen to fabricate XPT 104 whereas load-die 102 may be fabricated using an advanced process node that supports higher performance. Cost in terms of floor plan area in load-die 102 may also be reduced by moving PTR phases to XPT 104, thereby freeing up area (e.g., 5-10%) to be freed up for more high-performance compute components (e.g., cores, AI engines, graphics execution units, etc.).

In some embodiments, load-die 102 and XPT 104 may comprise substantially monocrystalline semiconductors, such as silicon or germanium as a substrate on which active devices are fabricated with traditional semiconductor processing methods. In some other embodiments, the substrates of load-die 102 and XPT 104 may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. In yet other embodiments, the substrates may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the substrates may comprise an intrinsic IV or III-V semiconductor material or alloy, not intentionally doped with any electrically active impurity; in alternate embodiments, nominal impurity dopant levels may be present. In still other embodiments, the substrates may comprise be organic materials such as silica-filled epoxy. In other embodiments, the substrates may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the substrates may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc.

In various embodiments, load-die 102 may include, or be a part of, one or more of a CPU, a memory device, e.g., a high-bandwidth memory device, a logic circuit, input/output circuitry, a transceiver such as a field programmable gate array transceiver, a gate array logic such as a field programmable gate array logic, of a power delivery circuitry, a Ill-V or a III-N device such as a Ill-N or III-N amplifier (e.g., GaN amplifier), Peripheral Component Interconnect Express (PCIe) circuitry, Double Data Rate transfer circuitry, or other electronic components known in the art.

Although not specifically shown in all of the present illustrations in order to not clutter the drawings, when DTD or DTPS interconnects are described, a first surface (e.g., of load-die 102 or XPT 104) may include a first set of conductive contacts, and a second surface (e.g., of XPT 104 or package substrate 108) may include a second set of conductive contacts. One or more conductive contacts of the first set may then be electrically and mechanically coupled to some of the conductive contacts of the second set by the DTD or DTPS interconnects. In some embodiments, the pitch of the DTD interconnects (e.g., 118) may be different from the pitch of the DTPS interconnects (e.g., 120), although, in other embodiments, these pitches may be substantially the same. In some embodiments, the DTPS interconnects disclosed herein may have a pitch between about 80 micrometer and 300 micrometer, while the DTD interconnects disclosed herein may have a pitch between about 0.7 micrometer and 100 micrometer.

The DTPS interconnects (e.g., 120) disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects (e.g., 118) disclosed herein may take any suitable form. In some embodiments, some or all of the DTD interconnects as described herein may comprise hybrid bond interconnects, metal-to-metal interconnects (e.g., copper-to-copper interconnects, or plated interconnects). In other embodiments, the DTD interconnects may be solder bumps (e.g., C4 bumps) or micro-bumps (e.g., C2 bumps). In embodiments where DTD interconnects comprise metal-to-metal bonds, the conductive contacts on either side of the DTD interconnect may be bonded together (e.g., under elevated pressure and/or temperature) without the use of intervening solder or an anisotropic conductive material. In some embodiments, a thin cap of solder may be used in a metal-to-metal interconnect to accommodate planarity, and this solder may become an intermetallic compound during processing. In some metal-to-metal interconnects that utilize hybrid bonding, a dielectric material (e.g., silicon oxide, silicon nitride, silicon carbide, or an organic layer) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the ICs on either side of a set of DTD interconnects may be unpackaged dies, and/or the DTD interconnects may include small conductive bumps or pillars (e.g., copper bumps or pillars) attached to the respective conductive contacts by solder. In some embodiments, some or all of the DTD interconnects may be solder interconnects that include a solder with a higher melting point than a solder included in some or all of the DTPS interconnects. For example, when the DTD interconnects are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth) or tin, silver, and bismuth. In some embodiments, a lower-temperature solder may include indium, indium and tin, or gallium.

In some embodiments, a set of DTD interconnects may include any appropriate solder material, such as any of the materials discussed above for the DTPS interconnects. In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others. Note that in FIG. 1 and in subsequent figures, the DTD and DTPS interconnects are shown as aligned at the respective interfaces merely for ease of illustration; in actuality, some or all of them may be misaligned. In addition, there may be other components, such as bond pads, landing pads, metallization, etc. present in the assembly that are not shown in the figures to prevent cluttering. For example, through-connections may have pads on top of them and may land on larger pads on the top dies.

In packages as described herein, some or all of the DTD interconnects may have a finer pitch than the DTPS interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package support on either side of a set of DTPS interconnects. In particular, the differences in the material composition of ICs and package supports may result in differential expansion and contraction of the ICs and package supports due to heat generated during operation (as well as the heat applied during various manufacturing operations). To mitigate damage caused by this differential expansion and contraction (e.g., cracking, solder bridging, etc.), the DTPS interconnects in any of the packages as described herein may be formed larger and farther apart than DTD interconnects, which may experience less thermal stress due to the greater material similarity of the pair of dies on either side of the DTD interconnects.

In various embodiments, inductors 106 may comprise coaxial magnetic inductors layer (MIL) structure embedded within insulator 112 of package substrate 108. In some embodiments, the coaxial MIL structure may include a copper-lined plated through-hole (PTH) surrounded by a high permeability magnetic material such as magnetic resin. The magnetic resin may further include ferrite particle fillers. In other embodiments, the coaxial MIL structure may comprise a ferrite core with a cylindrical shell. In yet other embodiments, inductors 106 may comprise magnetic interconnects (or magnetic cores, ferrite cores, etc.) that may be manufactured in the shape of a hollow cylindrical shell (or the like), embedded and/or otherwise disposed in insulator 112 of package substrate 108, where the magnetic interconnects surround copper filled PTH vias. In various embodiments, the magnetic materials of inductors 106 may include one of more ferromagnetic (or ferrimagnetic) materials, including (but not limited to), cobalt, iron, iron oxide (e.g., ferric oxide and/or ferrous oxide), oxides and other compounds of iron, nickel, copper, magnesium, manganese, bismuth, antimony, yttrium, chromium, arsenic, cadmium, zinc, telluride (e.g., $FeOFe_2O_3$, NiO, CuO, MgO, $CuOFe_2O_3$, $MgOFe_2O_3$, $Y_3Fe_5O_{12}$, MnSb, $CrO_2$, MnAs, CdZnTe). In some embodiments, the magnetic materials of the magnetic interconnects comprising inductors 106 may be conductive metal alloys disposed as thin laminated layers, high resistivity oxides in bulk form, or microparticles dispersed in an epoxy resin medium and the like. Although the example embodiment shown in FIG. 1 and subsequent figures have inductors 106 embedded in package substrate 108, insulator 106 may also be disposed on a surface of package substrate 108, for example, in the form of an integrated component, or a discrete soldered component in other embodiments.

Power, ground, and/or signals may be transmitted between package substrate 108 and load-die 102 by copper pillars 116 and other conductive pathways. In other embodiments, power, ground, and/or signals may be transmitted between package substrate 108 and load-die 102 through DTPS interconnects 120, XPT 104, and DTD interconnects 118. Further, power and ground planes in package substrate 108 may facilitate power and ground connections to XPT 104 and/or load-die 102 as desired. Load-die 102 may further comprise capacitors and other components including active components such as MOSFET switches and diodes of a multi-domain, multi-phase VR according to various embodiments. In some embodiments, the active components of the VR, including switches and diodes may be comprised in XPT 104, whereas control circuits (e.g., XCU) controlling the switches may be comprised in load-die 102. Various other configurations are possible as discussed further herein.

In various embodiments, insulator 112 may comprise dielectric layers alternating with metal layers forming conductive pathways 110. In some embodiments, insulator 112 may comprise built-up layers of epoxy resin (and/or other organic polymer material). In some embodiments, insulator 112 may comprise bismaleimide-triazine (BT) resin, polyimide materials, glass reinforced epoxy matrix materials, organic dielectrics with inorganic fillers or low-k and ultra low-k dielectric (e.g., carbon-doped dielectrics, fluorine-doped dielectrics, porous dielectrics, and organic polymeric dielectrics). In other embodiments, insulator 112 may comprise a ceramic (and/or other insulating inorganic material). In some embodiments, package substrate 108 may comprise a glass fiber reinforced epoxy core with conductive metal layers alternating with insulating layers on either side. In some embodiments, package substrate 108 may comprise fire retardant grade 4 (FR-4) glass epoxy base with thin copper foil laminated on either side. For certain embodiments, a multilayer printed circuit board (PCB) may be used with copper foil and prepreg to make additional layers of metal comprising conductive pathways 110 and insulator 112 respectively. In particular, when package substrate 108 is formed using standard PCB processes, package substrate 108 may include FR-4, and conductive pathways 110 may be formed by patterned sheets of copper separated by built-up layers of the FR-4. Conductive pathways 110 may comprise copper (or other conductive metal) traces, lines, pads, vias, via pads, holes and/or planes. Conductive pathways 110 may be bordered by liner materials, such as adhesion liners and/or barrier liners, as suitable.

In some embodiments, package substrate 108 may be formed using a lithographically defined via packaging process. In some embodiments, package substrate 108 may be manufactured using standard organic package manufacturing processes, and thus package substrate 108 may take the form of an organic package. Any method known in the art for fabrication of package substrate 108 may be used, and for the sake of brevity, such methods will not be discussed in further detail herein.

In some embodiments, mold compound 114 may comprise silica-filled epoxy resin or other suitable organic polymer. In the embodiment shown in the figure, mold compound 114 encompasses load-die 102 and XPT 104 in their entireties. In other embodiments, mold compound 114 may partially encompass load-die 102, and/or XPT 104. For example, a surface of load-die 102 may be left exposed to attach a heat sink and/or another component on top. In other embodiments, mold compound 114 may be comprised of more than one material, for example, a first material surrounding load-die 102 and a second, different material surrounding XPT 104. In various embodiments, mold compound 114 may be disposed according to any suitable process, for example, deposition, lamination, and/or subsequent curing. In an example process, mold compound 114 may be first disposed around XPT 104 and copper pillars 116. If mold compound 114 is formed to completely cover XPT 104 and copper pillars 116, conductive contacts at the top surface XPT 104 and copper pillars 116 may be exposed using any suitable technique, including grinding, or etching, such as a wet etch, a dry etch (e.g., a plasma etch), a wet blast, or a laser ablation (e.g., using excimer laser). Subsequently, load-die 102 may be attached by interconnects 118, then additional mold material disposed around load-die 102, and cured.

Microelectronic assembly 100 may also include an underfill material (not shown). In some embodiments, the underfill material may extend between XPT 104 and package substrate 108, including around associated DTPS interconnects 120. The underfill material may be an insulating material, such as an appropriate epoxy material. In some embodiments, the underfill material may include a capillary underfill, non-conductive film (NCF), or molded underfill. In some embodiments, the underfill material may include an epoxy flux. The underfill material may be selected to have a coefficient of thermal expansion (CTE) that may mitigate or minimize the stress between XPT 104 and package substrate 108 arising from uneven thermal expansion in the microelectronic assembly 100. In some embodiments, the CTE of the underfill material may have a value that is intermediate to the CTE of the package substrate 108 (e.g., the CTE of insulator 112) and a CTE of XPT 104.

Microelectronic assembly 100 may also include a circuit board (not shown). Package substrate 108 may be coupled to the circuit board by interconnects 122 at the surface of package substrate 108 opposite to XPT 104. Interconnects 122 may be any suitable second-level interconnects, including solder balls for a ball grid array arrangement, pins in a pin grid array arrangement or lands in a land grid array arrangement. The circuit board may be a motherboard, for example, and may have other components attached to it. The circuit board may include conductive pathways and other conductive contacts for routing power, ground, and signals through the circuit board, as known in the art. In some embodiments, interconnects 122 may not couple package substrate 108 to a circuit board but may instead couple package substrate 108 to another IC package, an interposer, or any other suitable component.

Note that FIG. 1 is intended to show relative arrangements of the components within their assemblies, and that, in general, such assemblies may include other components that are not illustrated (e.g., various interfacial layers or various other components related to optical functionality, electrical connectivity, or thermal mitigation). For example, in some further embodiments, the assembly as shown in FIG. 1 may include more dies along with other electrical components. Additionally, although some components of the assemblies are illustrated in FIG. 1 as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

Figure 2:
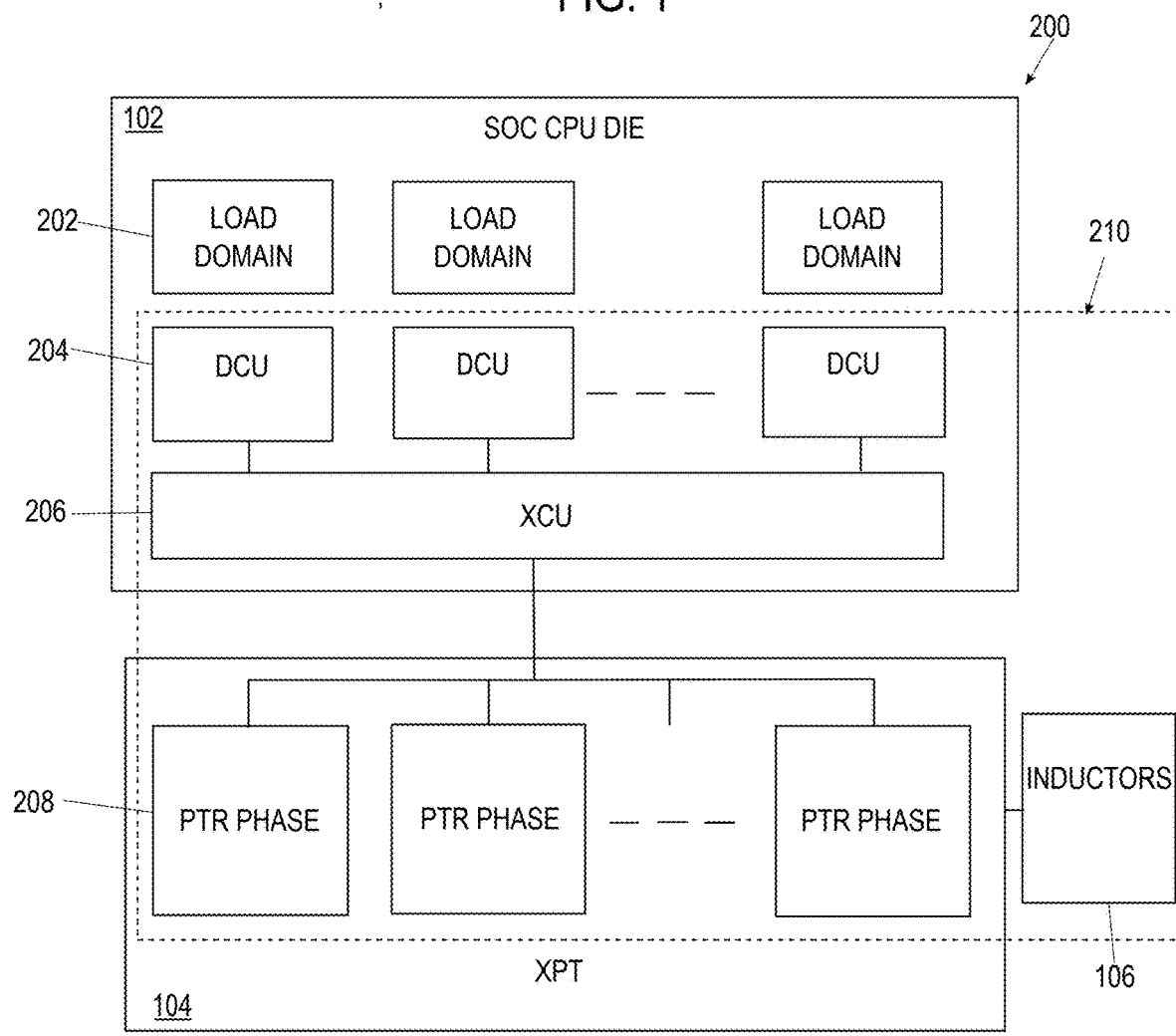
FIG. 2 schematic block diagram of details of an example VR, according to some embodiments of the present disclosure.

FIG. 2 is a simplified block diagram illustrating an example embodiment of a multi-domain multi-phase VR in a die assembly 200. Load-die 102 comprises one or more load domain 202, each being controlled by a respective DCU 204. In the example embodiment shown, load-die 102 is a System-on-chip (SOC) CPU die. In other embodiments, load-die 102 may comprise any suitable IC that consumes power, for example, application-specific IC (ASIC), programmable logic array (PLA), network processor, etc. In various embodiments, load domain 202 includes electrical load circuit(s) that consumes power. Examples of load domain 202 includes CPU, graphics processor unit (GPU), and the like. Each load domain 202 has power states (e.g., on, off) according to its power consumption and may consume power differently and independently of other load domains. According to various embodiments, each load domain 202 may also operate at independent voltage and frequency settings. For example, one load domain may operate at 0.8V whereas another load domain may operate at 1.2V. In a general sense, load domain 202 operates at a lower supply voltage (e.g., 0.8V, 1.2V) than power supplied to XPT 104 (e.g., 12V).

In various embodiments, each DCU 204 comprises control circuit(s) that regulates the electrical load circuit of corresponding load domain 202. For example, the DCU regulating a load domain comprising a logic circuit operating at 1.2V may regulate the voltage supply to the logic circuit to be within an appropriate range around 1.2V; another DCU regulating another load domain comprising a processor circuit operating at 0.8V may regulate the voltage supply to the processor circuit to be within an appropriate range around 0.8V, and so on. In another example, the DCU regulating a particular load domain may detect a catastrophic fault in the electrical load circuit therein and respond accordingly, for example, shutting current supply to the failed load domain. Various other operations are also contemplated within the broad scope of the embodiments, as discussed with reference to subsequent figures.

XCU 206 coupled to DCUs 204 may be in communication with one or more PTR phases 208 in XPT 104. PTR phases 208 comprise high-voltage drive and/or power stages of a VR 210 that regulates power supply to electrical load circuits comprising load domains 202. In some embodiments, PTR phases 208 may be supplied with power within a range of 1.8V to 12V. In an example embodiment, PTR phases 208 may be supplied with power between 3V and 5V. In various embodiments, XCU 206 may comprise a control circuit that mediates between DCUs 204 and XPT 104. For example, XCU 206 may map PTR phases 208 to DCUs 204 and vice versa. For example, XCU 206 may provide PWM drive signals to PTR phases 208 in XPT 104, receive feedback signals to regulate output voltage of inductors 106, and generate output current to load domains 202, among other functions as needed and discussed with reference to subsequent figures. DCUs 204, XCU 206 and PTR phases 208 along with inductors 106 may together comprise multi-domain multi-phase VR 210, disaggregated and spread (e.g., distributed) across three different package components, load-die 102, XPT 104 and package substrate 108.

In a general sense, disaggregating VR 210 into multiple package components is not straightforward as the individual components cannot be functionally tested comprehensively before assembly. Thus, the embodiments of the present disclosure are distinct from other solutions where the VR is in the load-die (e.g., fully integrated VR (FIVR)), the package substrate, or a discrete dedicated electronic module, with all its constituent elements (e.g., controller, phases, inductors, etc.) together in one single electronic module/component/part. One advantage of disaggregating as disclosed herein is that controllers (e.g., DCUs 204 and XCU 206) in load-die 102 may leverage advantages of advanced semiconductor manufacturing processes, whereas PTR phases 208 and inductors 106 may be manufactured using less advanced processing technologies that can withstand high voltages. Other advantages are discussed in reference to FIG. 1 above.

In various embodiments, DCU 204 generates feedback control signals to regulate output voltage and PWM signals to PTR phases 208 through XCU 206. XCU 206 may connect to multiple DCUs 204 and map DCUs 204 to PTR phases 208 arbitrarily based on digital configuration such that DCUs 204 operate agnostic of PTR phases 208. Mapping also applies to communication of analog and digital signals from PTR phases 208 to DCUs 204 through appropriate buses containing one or more lines, such as feedback lines, current sensing lines, etc. For example, depending on load current demand, XCU 206 may activate a number of PTR phases 208 so that each phase operates at a suitably efficient level over a given current range. In another example, XCU 206 may monitor overall load current and activate a selected number of PTR phases 208 to maintain an average current per-phase within a suitable window. PTR phases 208 in XPT 104 supplying different load domains 202 in load-die 102 may be supplied from different input voltages. PTR phases 206 serving same load domain 202 may be supplied by the same input voltage. In various embodiments, input voltage to PTR phases 208 in XPT 104 may be higher than supply voltages to load domains 202 on load-die 102.

Figure 3:
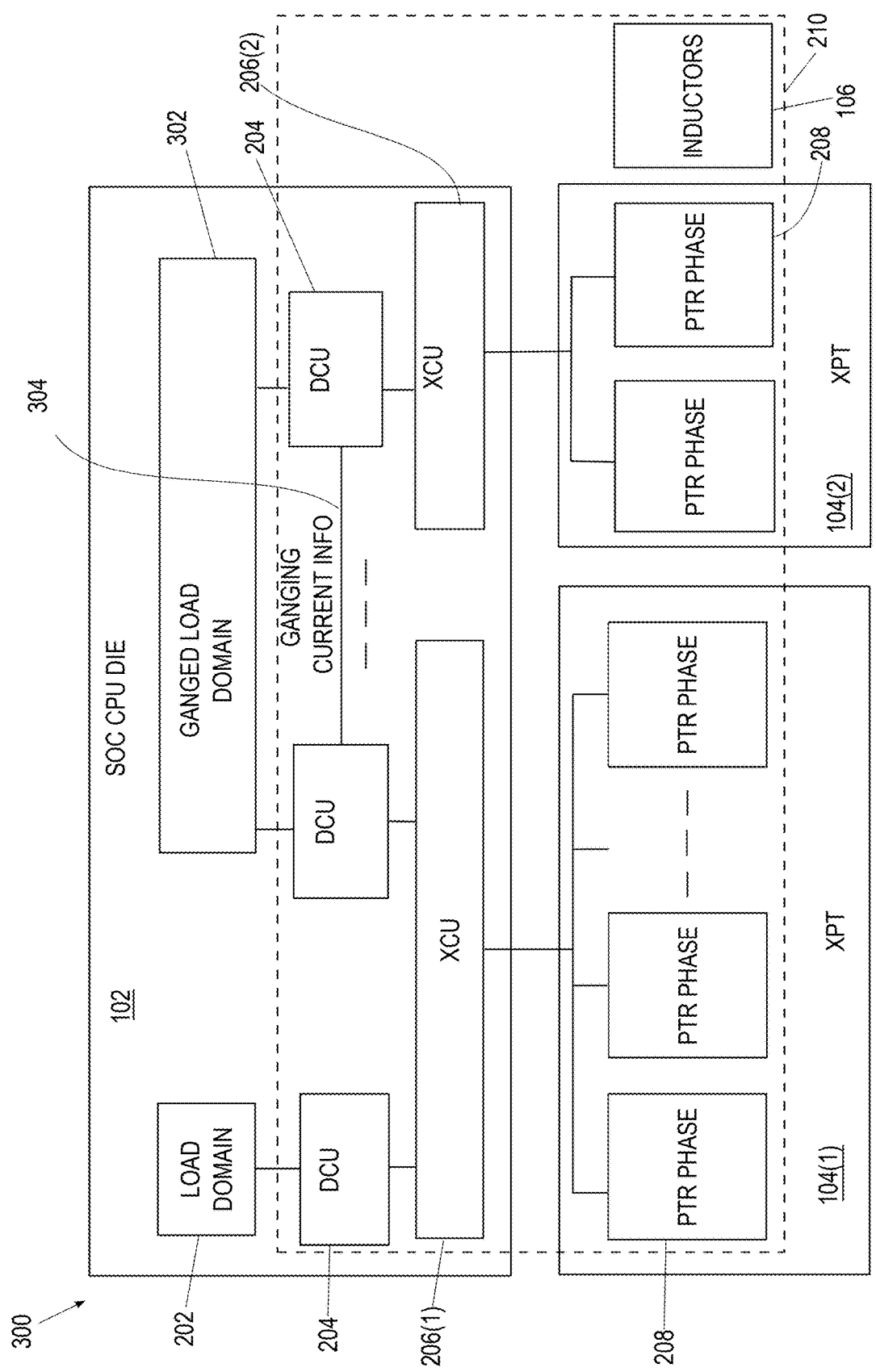
FIG. 3 schematic block diagram of details of an example VR, according to some embodiments of the present disclosure.

FIG. 3 is a simplified block diagram illustrating an example embodiment of a multi-domain multi-phase VR with ganging in a die assembly 300. Multiple load domains 202 may be "ganged" or combined into a single ganged load domain 302. Various methods exist in the art to perform such ganging; any of such methods may be used herein within the scope of the embodiments. For example, one load domain in ganged load domain 302 acts as a primary domain and all other load domains in ganged load domain 302 are secondary domains that follow the voltage programmed to the primary domain. In another example, output pins from various load domains in ganged load domain 302 may be coupled together. By using ganging, PTR phases 208 from multiple dies 104(1) and 104(2) may be configured to serve the same ganged load domain 302. Each XPT 104(1) and 104(2) may be controlled by a separate XCU 206(1) and 206(2) respectively. In such embodiments, DCUs 204 in communication with ganged load domain 302 may be connected to share ganging current information 304 among them and achieve load balancing between PTR phases 208 irrespective of the specific XPT 104(1) or 104(2) to which PTR phases 208 belong and enable ganged load domain 302 to be agnostic to the specific XPT 104(1) or 104(2) enabling the voltage regulation. The configuration of such VR 210 may also include individual load domains 202 controlled by separate DCUs 204 as shown.

Figure 4:
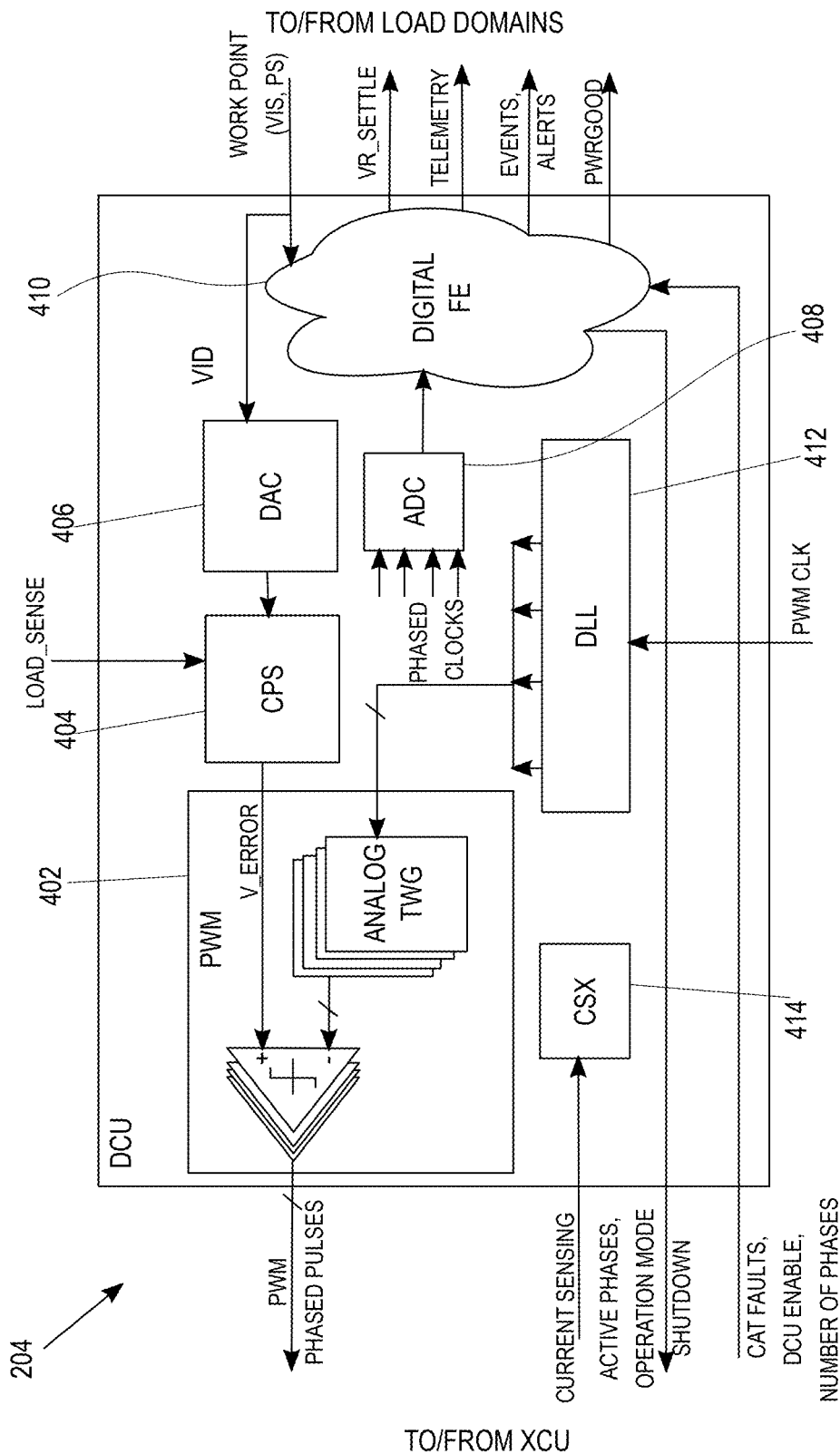
FIG. 4 is schematic block diagram of details of an example VR, according to some embodiments of the present disclosure.

FIG. 4 is a simplified block diagram of an example DCU 204 according to various embodiments. DCU 204 includes a PWM 402, a compensator (CPS) module 404, a DAC 406, an ADC 408, a digital front end (FE) 410, a delay locked loop (DLL) 412, and a current sensor process (CSX) module 414. In various embodiments, digital FE 410 serves as a front end for any communication with load domains 202, including SOC power management (PM) entities, in load-die 102. In various embodiments, digital FE 410 processes and controls work point (WP) sequences, such as VR_SETTLE signal (e.g., communicates states of supply voltage, for example, a voltage identification definition (VID) transition), active PTR phases, operation modes (e.g., fuse-less, clock-less, turbo, continuous current mode (CCM), discontinuous conduction mode (DCM), etc.), telemetry, alerts/events, and power status (e.g., PWR-GOOD) notifications. In some embodiments, digital FE 410 processes and controls IN and OUT catastrophic faults (e.g., over-voltage or over-current) that requires safely shutting down VR 210. In various embodiments, digital FE 410 receives DCU ENABLE signals (e.g., informing of at least one of PTR phases 208 mapped to DCU 204) and number of mapped PTR phases 208 from XCU 206.

In various embodiments, DAC 406 converts digital VID code to analog voltage level. CPS 404 closes a VR voltage loop by comparing between desired voltage (e.g., DAC output) and actual load voltage level (LOAD_SENSE) and creating "voltage error" signal (V_ERROR), which is sent to PWM 402. DLL 412 generates PWM clock phases to be fed into PWM 402. PWM 402 generates PWM phased pulses (e.g., for power trains, N/P drivers) that are fed to XCU 206 for enabling corresponding PTR phases 208 in XPT 104. In various embodiments, PWM 402 comprises an analog triangle wave generation (TWG) that generates phased voltage triangles, which are input into a comparator that generates the PWM phased pulses by comparing them with the V_ERROR signal from CPS 404. CSX 414 may process current sensing information from PTR phases 208 through XCU 206. ADC 408 may digitize analog data such as current sensing, voltages, etc. for telemetry and debug.

Figure 5:
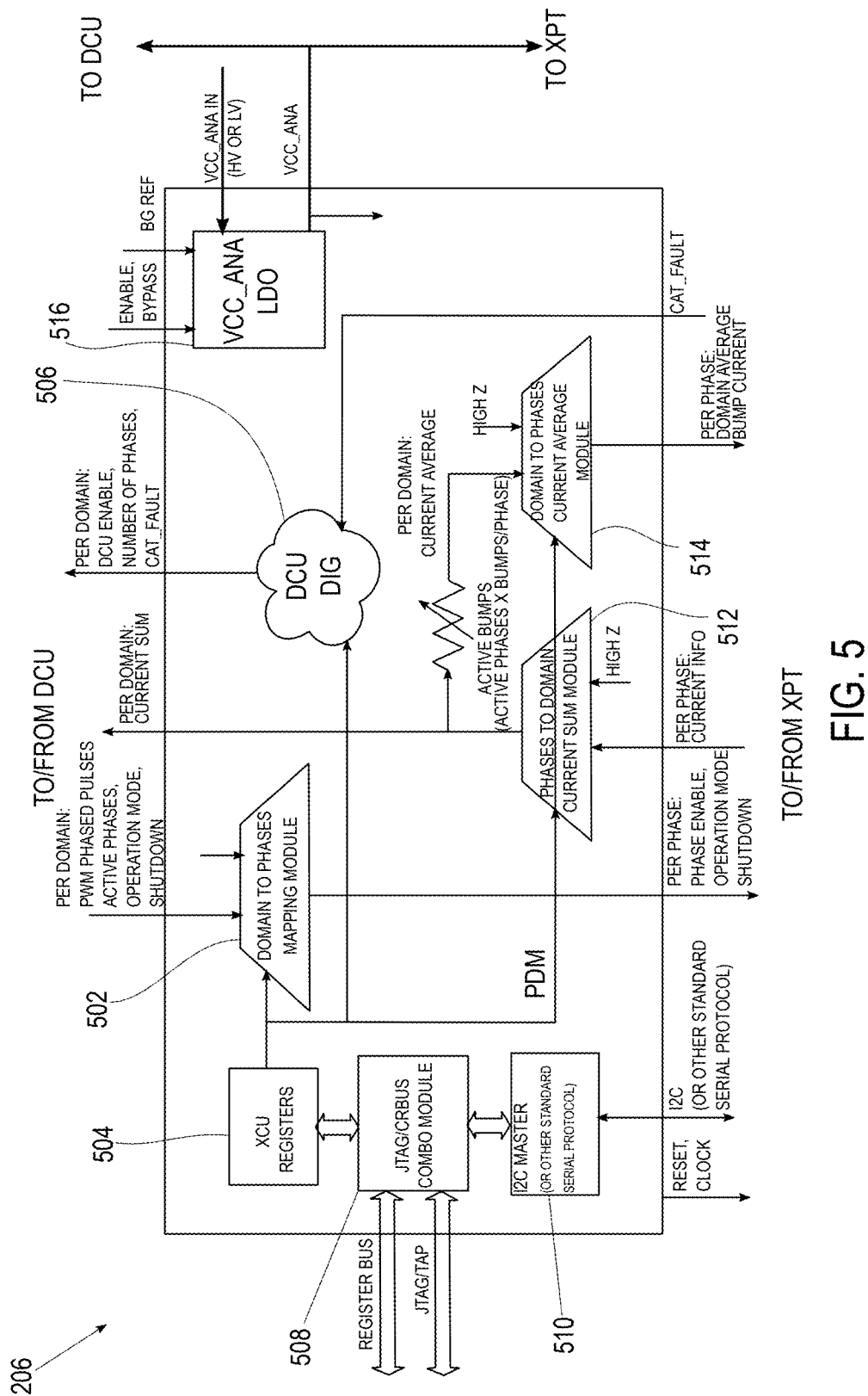
FIG. 5 is a schematic block diagram of details of an example VR, according to some embodiments of the present disclosure.

FIG. 5 is a simplified block diagram illustrating an example XCU 206 according to various embodiments. XCU 206 comprises an interface (e.g., bus) with XPT 104 through which it receives and sends information relevant to PTR phases 208 and inductor 106. The interface with XPT 104 comprises two channels: a first channel communicating information common to circuits in XPT 104, such as reset, clock, I2C data, and catastrophic faults (if any); and a second channel communicating information specific to each of PTR phases 208 in XPT 104, such as current, enable, operation mode and shutdown. XCU 206 may enable configurable mapping between DCUs 204 in load-die 102 and PTR phases 208 in XPT 104. Each of PTR phases 208 may be mapped to any DCU 204 or none (un-mapped). Domain information from individual DCUs 204 may be translated into per-phase inputs and driven to XPT 104. Phase information from XPT 104 may be translated into per-domain inputs and driven into relevant DCU 204.

A domain to phases mapping module (DPMM) 502 may receive per-domain information from DCUs 204, convert the per-domain information to per-phase inputs, and send the per-phase inputs to a relevant one of PTR phases 208 in XPT 104 over the second channel. In an example embodiment, the per-domain information from a particular one of DCUs 204 comprises PWM phased pulses, whether to enable PTR phases 208, operation mode of PTR phases 208 needed by corresponding load domain 202, and shutdown signals. The per-phase inputs comprise enable, operation mode, and shutdown signals relevant to the particular one of PTR phases 208.

XCU registers 504 may generate or store mapping information, comprising, for example, phase-to-domain mapping (PDM) configuration bits with identifying information about particular ones of PTR phases 208 mapped to particular ones of DCUs, 204 a number of DCUs 204 and a number of PTR phases 208. The PDM configuration bits may be used by DPMM 502 to map DCU 204 with one or more PTR phases 208 (and vice versa). For example, a particular one of PTR phases 208 may be mapped to one or more DCUs 204. Likewise, a particular one of DCUs 204 may be mapped to one or more PTR phases 208.

Using the information in the PDM configuration bits, DPMM 504 may convert the per-domain information to per-phase information. For example, PDM [7]=2 may map phase XPT_PHASE_7 with domain controller DCU_2. In a general sense, DPMM 502 may map PTR phases 208 in XPT 104 to any DCU 204 in load-die 102 or may un-map an already mapped one of PTR phases 208 according to the PDM configuration bits from XCU registers 504. PTR phases 208 may not be aware of the specific load domain 202 or DCU 204 that they are mapped to, because DPMM 502 in XCU 206 mediates between them, aggregating information from one, translating it into information relevant to the other and sending the translated information to the other. For example, PTR phases 208 do not store identifying information about any of DCUs 204 to which they are mapped.

Using the PDM configuration bits, a DCU digital module (DCU DIG) 506 may aggregate per-domain information such as the specific DCUs enabled, number of phases enabled per-domain, catastrophic fault signals received into XCU 206 and send the per-domain information to appropriate DCUs 204. In an example embodiment, DCU DIG 506 receives per-phase information from PTR phases 208, converts the per-phase information into per-domain inputs using the PDM configuration bits, and sends the per-domain inputs to a relevant one of DCUs 204 over an interface with DCUs 204. The per-phase information may comprise catastrophic fault signals, current, etc. from each of PTR phases 208. The per-domain inputs to each of DCUs may comprise whether to enable that specific domain, the number of connected PTR phases, domain current information (e.g., sum of current from connected PTR phases), any catastrophic fault in the associated PTR phases, etc. DCUs 204 may have no notion as to how many or which particular PTR phases 208 they are driving. For example, DCUs 204 may not store any identifying information about any of PTR phases 208 to which they are mapped.

XCU registers 504 may be accessed to write and read in various embodiments. A module 508 with functional and testing interfaces may also be present in XCU 206. The functional interface couples to a control register (CR) bus (e.g., 32-bit register bus) and the testing interface couples to a design for manufacturability, testability and debuggability (DFx) Joint Test Action Group/Test Access Port (JTAG/TAP) to enable bits to be written into and accessed from XCU registers 504. The information may also be translated into industry standard serial die-to-die communication protocol, such as I2C in an I2C master block 510 over an I2C bus, with the I2C slave residing in XPT 104. In various embodiments, I2C master block 510 may function as a translating module, translating information received on the CR bus into an industry standard serial protocol, such as I2C. The I2C bus may be used to interact with XPT 104 for data transfer back and forth between XPT 104 and XCU 206.

XCU 206 may perform per-domain current sensing averaging using appropriate circuit modules, for example, for power train phase current balancing operation. A phases to domain current sum module (PDCSM) 512 may sum current from all PTR phases 208 mapped to DCUs 204 according to the PDM configuration bits and sends the current sum information to DCUs 204. PDCSM 512 may map per-phase current information to per-domain current sum, which may be fed to DCUs 204. A domain to phase current average module (DPCAM) 514 may perform a per-voltage bump (PTR) current averaging calculation based on the number of active PTRs and send the averaged current information back to XPT 104. In an example embodiment, DPCAM 514 performs a per-bump current averaging calculation for each active one of PTR phases 208, wherein any of PTR phases 208 may comprise more than one voltage bump circuit that lowers voltage from a high voltage to a low voltage at any given time.

An analog voltage supply (VCC_ANA) low drop out regulator (LDO) 516 may enable an analog power rail for analog blocks in load-die 102 and XPT 104. In various embodiments, the input voltage to load domains 202 (e.g., SOC CPU input voltage) may be flexible, with high voltage or low voltage (LDO bypass) implemented based on availability.

Figure 6:
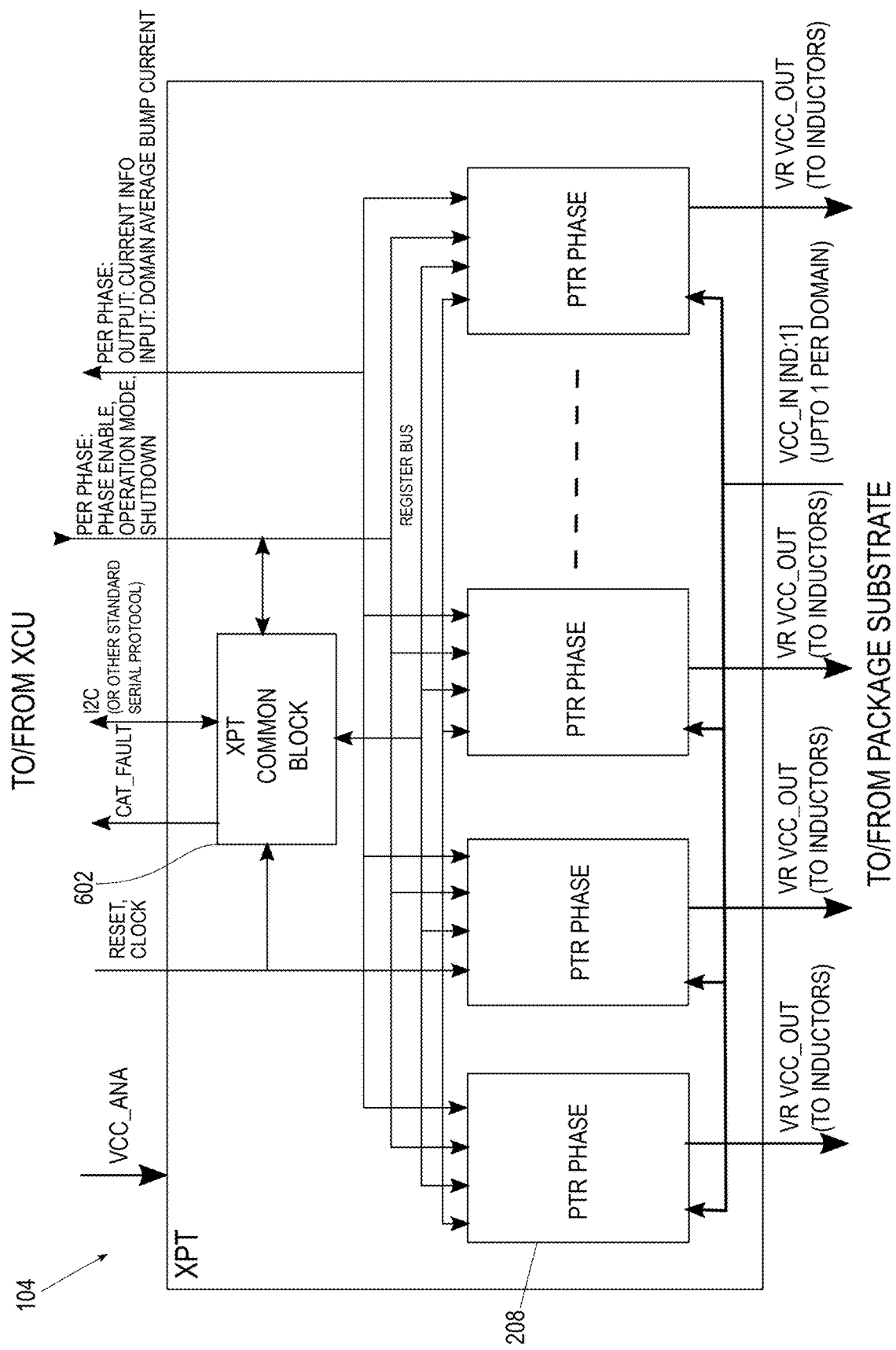
FIG. 6 is a schematic block diagram of details of an example VR, according to some embodiments of the present disclosure.

FIG. 6 is a simplified block diagram illustrating an example XPT 104 according to various embodiments. XPT 104 comprises a high-voltage die that contains VR power driver stages, also referred to herein as power trains or PTRs grouped into identical, independent PTR phases 208 that drive the VR output power (VR VCC_OUT) into inductors 106 located in package substrate 108. In various embodiments, XPT 104 comprises a high-voltage block including a plurality of PTR phases 208, and a low-voltage block including a XPT Common Block 602. In various embodiments, XPT Common Block 602 comprises a circuit that aggregates data from XCU 206 and responds accordingly. In many embodiments, PTR phases 208 comprises bi-polar junction transistors (BJT) or MOSFET switches of VR 210. A size of XPT 104 may be based on a number of PTR phases 208. Thus, power train die size may be easily modularized or configured by adding or removing phases as appropriate. The number of PTR phases 208 active at any given time may be based on the number of voltage bumps/phase, determined based on aggregated current requirements, including number of load domains 202 or DCUs 204, and current requirements per-domain, which information is received from XCU 206.

XPT 104 comprises two interfaces: one with XCU 206 and another with package substrate 108. With XCU 206, XPT 104 may communicate analog power (e.g., VCC_ANA), reset, clock, I2C (or other standard serial protocol), catastrophic fault information. This information, being common to all PTR phases 208 of XPT 104, may be communicated through XPT Common Block 602. Per-phase information such as current (IN/OUT), phase enable, operation mode, shutdown, etc. may be sent directly to individual PTR phases 208 over an appropriate register bus (e.g., 32 bit).

With package substrate 108, each of PTR phases 208 in XPT 104 may communicate input voltage (VCC_IN), which may be supplied over multiple VCC_IN rails from package support 108, depending upon the power consumption of load domains 202 in load-die 102. In various embodiments, all phases regulating the same load domain are fed by the same VCC_IN rail. Each domain phases group can be fed by different VCC_IN rails. Each of PTR phases 208 may communicate per-phase power in the form of output voltage (VR VCC_OUT) to individual inductors 106, which are electrically coupled to load domains 202 through XCU 206 in load-die 102.

In various embodiments, XPT Common Block 602 may serve to access appropriate registers in XPT 104 and to generate or receive catastrophic fault signals in the event of a catastrophic fault such as power loss, overheating, overvoltage, over-current, and others. As I2C slave, XPT Common Block 602 may translate information from XCU 206 received over I2C bus into internal parallel registers bus that accesses all power train die registers locally in XPT Common Block 602 and individual PTR phases 208. XPT Common Block 602 may locate JTAG endpoint, multiplexing JTAG data with I2C communication protocol data to enable dual I2C/JTAG source access to registers in XPT 104. In various embodiments, XPT Common Block 602 may overload the safe shutdown indication received from XCU 206 and drive the information to PTR phases 208 for shutting them down (e.g., to avoid burning the die). In some embodiments, catastrophic faults generated in XPT 104 may be signaled to XCU 206, for example, so that corresponding DCUs 204 may be shut down. XPT Common Block 602 may enable other common functionalities such as pins for probing/testing, and network final multiplexing.

Figure 7:
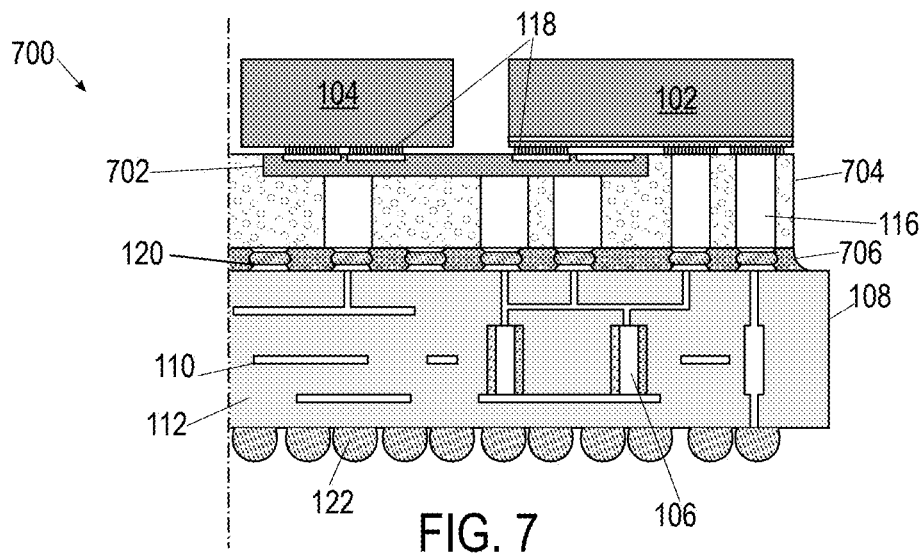
FIG. 7 is a simplified cross-sectional view of an example VR packaging architecture, according to some embodiments of the present disclosure.

FIG. 7 is a simplified cross-sectional view of a packaging architecture for a multi-domain multi-phase VR according to an example embodiment. Load-die 102 and XPT 104 may be located side-by-side in microelectronic assembly 700. A semiconductor bridge 702 may enable electrical coupling between load-die 102 and XPT 104 through DTD interconnects 118. Semiconductor bridge 702 may be embedded in an organic interposer 704 comprising copper pillars 116 that provide through-connections to package substrate 108 having inductors 106. In some embodiments, semiconductor bridge 702 may be passive. In other embodiments, semiconductor bridge 702 may comprise active components such as transistors and diodes. DTPS interconnects 120 may provide electrical and mechanical coupling between interposer 704 and package substrate 108. An underfill 706 between interposer 704 and package substrate 108 may provide thermo-mechanical stability and reliability for DTPS interconnects 120. Signal connections between the various components of VR 210 spread across load-die 102, XPT 104 and package substrate 108 may be completed through suitable interconnects 118 and 120.

Figure 8:
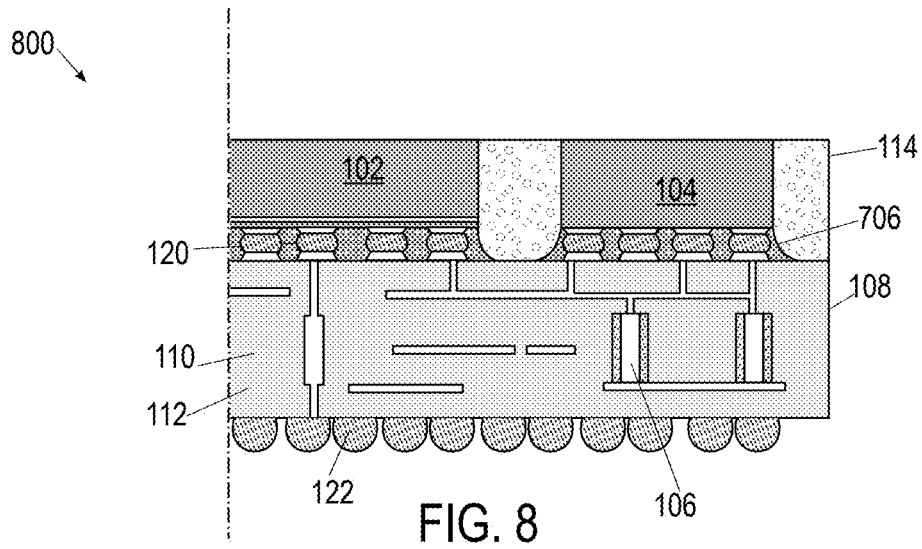
FIG. 8 is a simplified cross-sectional view of another example VR packaging architecture, according to some embodiments of the present disclosure.

FIG. 8 is a simplified cross-sectional view of another packaging architecture for a multi-domain multi-phase VR according to an example embodiment. Load-die 102 and XPT 104 may be located side-by-side in microelectronic assembly 800. Load-die 102 and XPT 104 may be coupled directly to package substrate 108 with DTPS interconnects 120. Underfill 706 between the dies and package substrate 108 may provide thermo-mechanical stability and reliability for DTPS interconnects 120. Inductors 106 may be disposed in package substrate 108. Signal connections between the various components of VR 210 spread across load-die 102, XPT 104 and package substrate 108 may be completed through interconnects 120.

Figure 9:
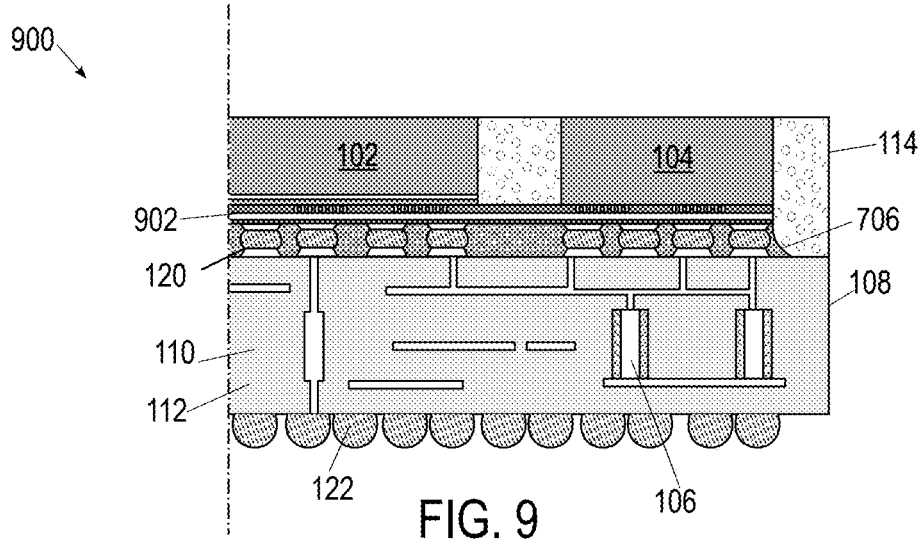
FIG. 9 is a simplified cross-sectional view of yet another example VR packaging architecture, according to some embodiments of the present disclosure.

FIG. 9 is a simplified cross-sectional view of yet another packaging architecture for a multi-domain multi-phase VR according to an example embodiment. Load-die 102 and XPT 104 may be located side-by-side in microelectronic assembly 900. Load-die 102 and XPT 104 may be attached to a redistribution panel 902, for example, in a panel level fan-out type of packaging architecture. Redistribution panel 902 may comprise a set of redistribution layers formed on a panel carrier by laminating or spinning on a dielectric material (e.g., a glass fiber reinforced core) and creating conductive vias and lines by laser drilling and plating. Suitable vias and conductive traces in redistribution panel 902 may enable electrical coupling between load-die 102 and XPT 104. The die assembly may be attached to package substrate 108 with DTPS interconnects 120 and a suitable underfill 706 filled in the spaces therebetween. Inductors 106 may be disposed in package substrate 108. Signal connections between the various components of VR 210 spread across load-die 102, XPT 104 and package substrate 108 may be completed through appropriate vias and conductive traces in redistribution panel 902 and interconnects 120.

In various embodiments, any of the features discussed with reference to any of FIGS. 1-9 herein may be combined with any other features to form a package with one or more ICs as described herein, for example, to form a modified microelectronic assembly 100. Some such combinations are described above, but, in various embodiments, further combinations and modifications are possible.

Example Methods

Figure 10:
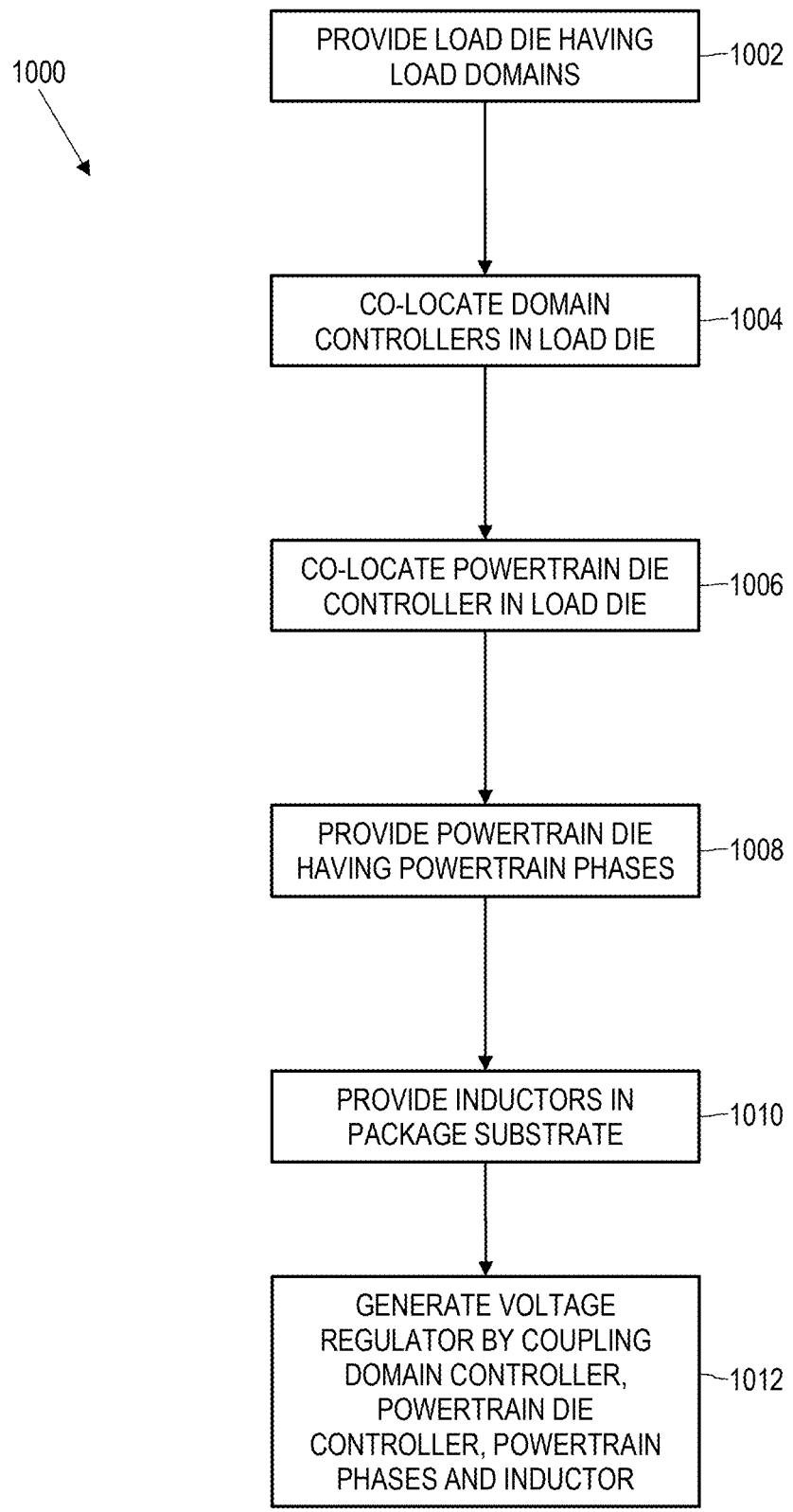
FIG. 10 is a flow diagram of an example method of fabricating a microelectronic assembly, according to various embodiments of the present disclosure.

FIG. 10 is a flow diagram of an example method 1000 of fabricating a microelectronic assembly 100, according to various embodiments of the present disclosure. Although FIG. 10 illustrates various operations performed in a particular order, this is simply illustrative, and the operations discussed herein may be reordered and/or repeated as suitable. Further, additional processes which are not illustrated may also be performed without departing from the scope of the present disclosure. Also, various ones of the operations discussed herein with respect to FIG. 10 may be modified in accordance with the present disclosure to fabricate others of microelectronic assembly 100 disclosed herein.

At 1002, load-die 102 having one or more load domains 202 may be provided. At 1004, DCUs 204 corresponding to load domains 202 may be co-located on load-die 102. In some embodiments, each DCU corresponds to a distinct load domain. In other embodiments, several load domains may be ganged together into a ganged load domain 302 and separate DCUs sharing ganged current information 304 may be provided. At 1006, XCU 206 may be co-located in load-die 102. At 1008, XPT 104 having PTR phases 208 may be provided. At 1010, inductors 106 may be provided in package substrate 108. At 1012, DCUs 204, XCU 206, XPT 104 and inductors 106 may be coupled to generate VR 210.

In some embodiments, coupling DCUs 204, XCU 206, XPT 104 and inductors 106 may comprise, at DCU 204, converting (e.g., by digital FE 410), digital VID code to analog voltage representing a desired voltage level at a particular load domain, and generating (e.g., by CPS 404) a voltage error signal when the desired voltage level is different from actual voltage level measured at the particular load domain, generating (e.g., by PWM 402) PWM phased pulses for regulating PTR phase drivers, processing (e.g., by CSX 414) current sensing information from PTR phases 208; and digitizing (e.g., by digital FE 410) analog data for telemetry and debug.

In some embodiments, coupling DCUs 204, XCU 206, XPT 104 and inductors 106 may comprise electrically connecting load-die 102, XPT 104, and inductors 106 in a package (e.g., microelectronic assembly 100) with suitable interconnects. In some embodiments, the interconnects comprise DTD interconnects 118 between load-die 102 and XPT 104, DTPS interconnects 120 between XPT 104 and package substrate 108, and copper pillars 116 in an interposer (e.g., mold compound 114) between load-die 102 and package substrate 108 comprising inductors 106. In some other embodiments, the interconnects comprise DTD interconnects 118 between load-die 102 and XPT 104, DTPS interconnects 120 between XPT 104 and package substrate 108, and TSVs 109 in XPT 104 between load-die 102 and package substrate 108 comprising inductors 106. In some other embodiments, the interconnects comprise conductive vias and traces in redistribution panel 902 electrically coupling load-die 102 and XPT 104, and DTPS interconnects 120 between redistribution panel 902 and package substrate 108. In some other embodiments, the interconnects comprise DTPS interconnects 120 between load-die 102 and package substrate 108 and between XPT 104 and package substrate 108.

Although the operations of method 1000 are illustrated in FIG. 10 once each and in a particular order, the operations may be performed in any suitable order and repeated as desired. For example, one or more operations may be performed in parallel to manufacture multiple IC packages substantially simultaneously. In another example, the operations may be performed in a different order to reflect the structure of a particular IC package in which one or more microelectronic assembly 100 as described herein may be included. Numerous other variations are also possible to achieve the desired structure of microelectronic assembly 100.

Furthermore, the operations illustrated in FIG. 10 may be combined or may include more details than described. Still further, method 1000 shown in FIG. 10 may further include other manufacturing operations related to fabrication of other components of the microelectronic assemblies described herein, or any devices that may include microelectronic assemblies as described herein. For example, method 1000 may include various cleaning operations, surface planarization operations (e.g., using CMP), operations for surface roughening, operations to include barrier and/or adhesion layers as desired, and/or operations for incorporating packages as described herein in, or with, an IC component, a computing device, or any desired structure or device.

Figure 11:
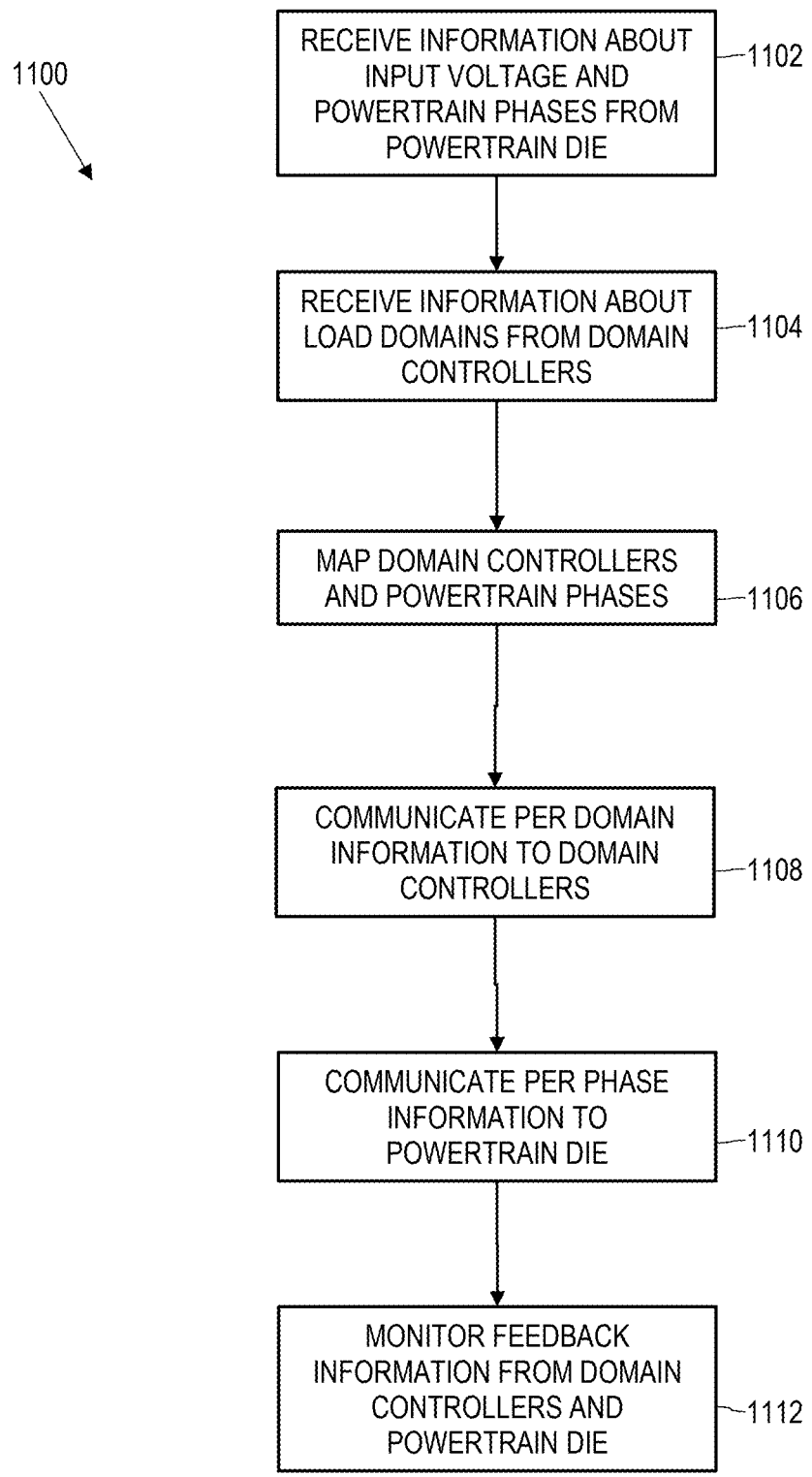
FIG. 11 is a flow diagram of an example method of fabricating a microelectronic assembly, according to various embodiments of the present disclosure.

FIG. 11 is a flow diagram of an example method 1100 of operating XCU 206, according to various embodiments of the present disclosure. At 1102, XCU 206 receives information about input voltages (e.g., VCC_ANA, VCC_IN) and PTR phases 208 (e.g., number, catastrophic fault signals, etc.) from XPT 104. At 1104, XCU 206 receives information about load domains 202 from corresponding DCUs 204 (e.g., number of load domains, current sensing, etc.) At 1106, XCU 206 may map DCUs 204 to PTR phases 208 suitably. In various embodiments, the mapping comprises writing values of PTR PDM configuration bits in XCU registers 504. At 1108, XCU 206 may communicate per-domain information to corresponding DCUs 204. At 1110, XCU 206 may communicate per-phase information to XPT 104. In some embodiments, the per-phase information of a particular one of the PTR phases 208 comprises enable, operation mode, and shutdown signals relevant to the particular one of PTR phases 208. At 1112, XCU 206 may monitor feedback information (e.g., current sensing, load change, phase changes, catastrophic fault signals, etc.) from DCUs 204 and XPT 104. In various embodiments, monitoring feedback information from XPT 104 comprises communicating data over industry standard serial protocol, such as I2C, to low voltage XPT Common Block 602 in XPT 104. In some embodiments, monitoring feedback information further comprises communicating reset and clock values to XPT 104.

Example Devices and Components

Figure 12:
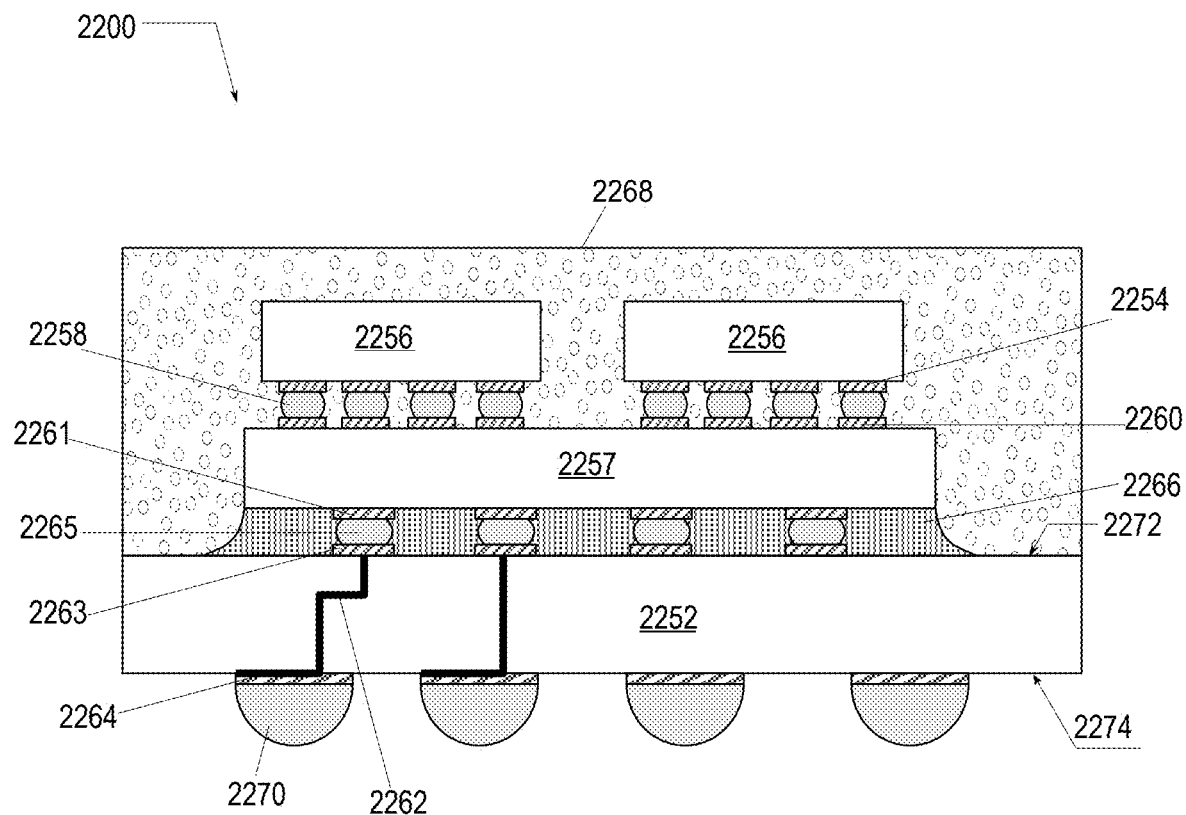
FIG. 12 is a cross-sectional view of a device package that may include one or more IC packages in accordance with any of the embodiments disclosed herein.
Figure 13:
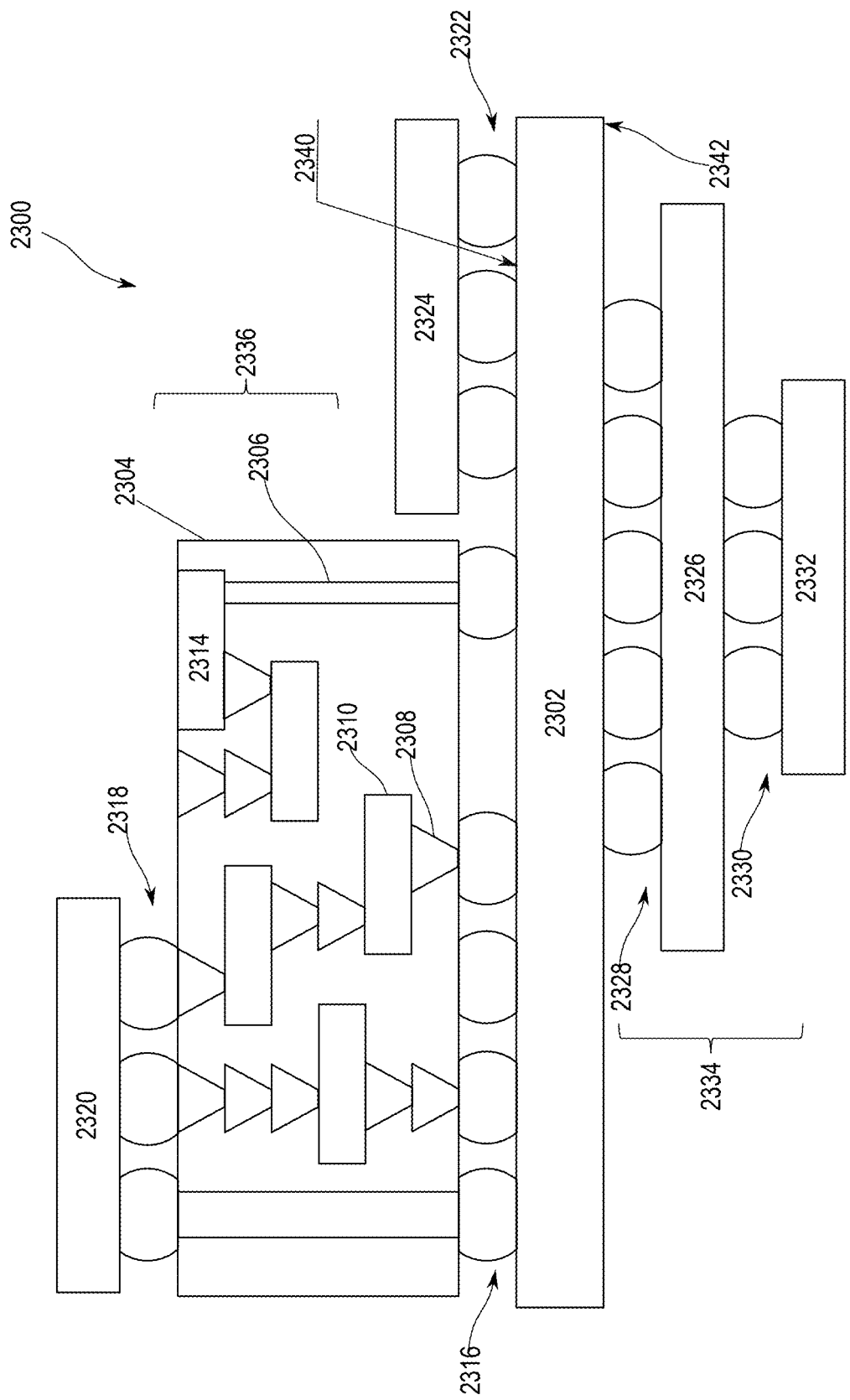
FIG. 13 is a cross-sectional side view of a device assembly that may include one or more IC packages in accordance with any of the embodiments disclosed herein.
Figure 14:
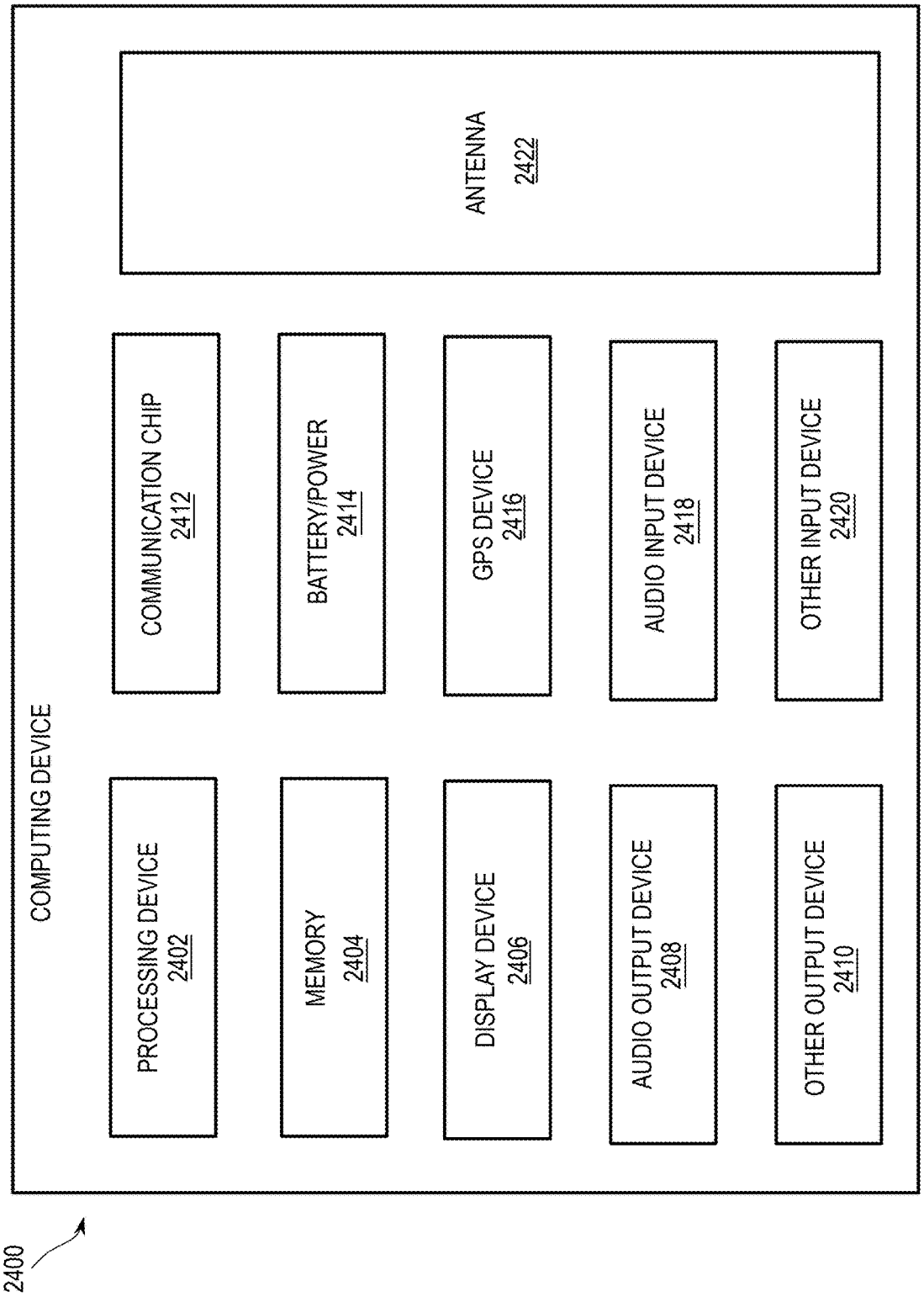
FIG. 14 is a block diagram of an example computing device that may include one or more IC packages in accordance with any of the embodiments disclosed herein.

The packages disclosed herein, e.g., any of the embodiments shown in FIGS. 1-9 or any further embodiments described herein, may be included in any suitable electronic component. FIGS. 12-14 illustrate various examples of packages, assemblies, and devices that may be used with or include any of the IC packages as disclosed herein.

FIG. 12 is a side, cross-sectional view of an example IC package 2200 that may include IC packages in accordance with any of the embodiments disclosed herein. In some embodiments, the IC package 2200 may be a system-in-package (SiP).

As shown in FIG. 12, package support 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias, e.g., as discussed above with reference to FIG. 1.

Package support 2252 may include conductive contacts 2263 that are coupled to conductive pathway 2262 through package support 2252, allowing circuitry within dies 2256 and/or interposer 2257 to electrically couple to various ones of conductive contacts 2264 (or to other devices included in package support 2252, not shown).

IC package 2200 may include interposer 2257 coupled to package support 2252 via conductive contacts 2261 of interposer 2257, first-level interconnects 2265, and conductive contacts 2263 of package support 2252. First-level interconnects 2265 illustrated in FIG. 12 are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in FIG. 12 are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package support 2252 and interposer 2257 around first-level interconnects 2265, and mold 2268 may be disposed around dies 2256 and interposer 2257 and in contact with package support 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in FIG. 12 are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 13.

In various embodiments, any of dies 2256 may include portions of VR 210 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 comprising components of VR 210 as described herein, one or more of dies 2256 may be logic dies (e.g., silicon-based dies), one or more of dies 2256 may be memory dies (e.g., high-bandwidth memory), etc. In some embodiments, at least some of dies 2256 may not include components of VR 210 as described herein.

Although IC package 2200 illustrated in FIG. 12 is a flip-chip package, other package architectures may be used.

For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package support 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 13 is a cross-sectional side view of an IC device assembly 2300 that may include components having one or more microelectronic assembly 200 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 200 in accordance with any of the embodiments disclosed herein; e.g., any of the IC packages discussed below with reference to IC device assembly 2300 may take the form of any of the embodiments of IC package 2200 discussed above with reference to FIG. 12.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package support.

FIG. 13 illustrates that, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 12. In some embodiments, IC package 2320 may include at least one VR 210 as described herein. VR 210 is not specifically shown in FIG. 13 in order to not clutter the drawing.

Although a single IC package 2320 is shown in FIG. 13, multiple IC packages may be coupled to interposer 2304; indeed, additional interposers may be coupled to interposer 2304. Interposer 2304 may provide an intervening package support used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in FIG. 13, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including TSVs 2306. Interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 14 is a block diagram of an example computing device 2400 that may include one or more components having one or more IC packages in accordance with any of the embodiments disclosed herein. For example, any suitable ones of the components of computing device 2400 may include a microelectronic assembly including components of VR 210 in accordance with any of the embodiments disclosed herein. In another example, any one or more of the components of computing device 2400 may include any embodiments of IC package 2200 (e.g., as shown in FIG. 12). In yet another example, any one or more of the components of computing device 2400 may include an IC device assembly 2300 (e.g., as shown in FIG. 13).

A number of components are illustrated in FIG. 14 as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SOC die.

Additionally, in various embodiments, computing device 2400 may not include one or more of the components illustrated in FIG. 14, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more digital signal processors (DSPs), ASICs, CPUs, GPUS, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips; note that the terms "chip," "die," and "IC die" are used interchangeably herein). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives of it, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellitebased system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

SELECT EXAMPLES

The following paragraphs provide various examples of the embodiments disclosed herein.

Example 1 provides a microelectronic assembly, comprising: a first IC die (e.g., 102) having electrical load circuits (e.g., 202), first control circuits (e.g., 204), and a second control circuit (e.g., 206); a second IC die having powertrain (PTR) phase circuits (e.g., 208) electrically coupled to the first IC die; and inductors (e.g., 106) in a package substrate (e.g., 108) electrically coupled to the first IC die and to the second IC die within a package. The first control circuits regulate power to corresponding electrical load circuits, the second control circuit maps the first control circuits and the PTR phase circuits, the PTR phase circuits control power to the inductors, and the first control circuits, the second control circuit, the PTR phase circuits and the inductors operate together as a VR (e.g., 210) configured to receive power from the package substrate at a first voltage and to deliver power to the electrical load circuits at a second voltage, the first voltage being higher than the second voltage.

Example 2 provides the microelectronic assembly of Example 1, in which the inductors comprise MIL inductors.

Example 3 provides the microelectronic assembly of any of Examples 1-2, in which the PTR phase circuits are configured to operate at the first voltage.

Example 4 provides the microelectronic assembly of Example 3, in which the second IC die further comprises a common block circuit (e.g., 602) configured to operate at the second voltage.

Example 5 provides the microelectronic assembly of Example 4, in which the common block circuit is configured to interface with the second control circuit using a standard serial protocol.

Example 6 provides the microelectronic assembly of any of Examples 4-5, in which the common block circuit in the second IC die is configured to: generate signals when catastrophic faults are detected in the PTR phase circuits, and send the signals to the second control circuit on the first IC die.

Example 7 provides the microelectronic assembly of any of Examples 1-6, in which the PTR phase circuits comprise semiconductor switches configured to turn on or off to control power supply to the inductors.

Example 8 provides the microelectronic assembly of any of Examples 1-7, in which the PTR phase circuits are identical and independent of each other.

Example 9 provides the microelectronic assembly of any of Examples 1-8, in which the second control circuit maps individual ones of the first control circuits to one or more of the PTR phase circuits.

Example 10 provides the microelectronic assembly of any of Examples 1-9, in which the electrical load circuits are ganged together with a common ganging current, and the corresponding first control circuits are configured to share information about the common ganging current.

Example 11 provides the microelectronic assembly of any of Examples 1-10, in which: the first IC die is coupled to a first side of the second IC DTD interconnects (e.g., 118), and the second IC die is coupled to the package substrate with DTPS interconnects (e.g., 120) on a second side opposite to the first side.

Example 12 provides the microelectronic assembly of Example 11, in which TSVs (e.g., 109) in the second IC die electrically couple the first IC die to the package substrate.

Example 13 provides the microelectronic assembly of any of Examples 11-12, in which copper pillars (e.g., 116) in an organic insulator (e.g., 114) between the first IC die and the package substrate electrically couple the first IC die to the package substrate.

Example 14 provides the microelectronic assembly of any of Examples 11-13, in which the first IC die and the second IC die are encased in a mold compound (e.g., 114).

Example 15 provides the microelectronic assembly of any of Examples 1-14 (e.g., FIG. 9), in which the first IC die is side-by-side with the second IC die, and electrically coupled to the second IC die through conductive vias and traces on a first side of a redistribution panel (e.g., 902), the redistribution panel is electrically coupled to the package substrate with DTPS interconnects (e.g., 120) on a second side opposite to the first side.

Example 16 provides the microelectronic assembly of any of Examples 1-15 (e.g., FIG. 7), in which: the first IC die is side-by-side with the second IC die, and electrically coupled to the second IC die through a semiconductor bridge (e.g., 702) in an interposer (e.g., 704), the first IC die and the second IC die are coupled to the semiconductor bridge with DTD interconnects (e.g., 118) on a first side of the semiconductor bridge, and the interposer is coupled to the package substrate with DTPS interconnects (e.g., 120) on a second side of the semiconductor bridge opposite to the first side.

Example 17 provides the microelectronic assembly of any of Examples 1-16, in which: the first IC die is side-by-side with the second IC die (e.g., FIG. 8), and electrically coupled to the second IC die through conductive traces and vias in the package substrate, the first IC die and the second IC die are coupled to the package substrate with DTPS interconnects.

Example 18 provides the microelectronic assembly of any of Examples 1-17, in which the first IC die is manufactured using a first process, and the second IC die is manufactured using a second process different from the first process.

Example 19 provides a control circuit (e.g., 206) in an IC die, comprising (e.g., FIG. 5) a mapping module (e.g., 502); a register (e.g., 504); a digital control module (e.g., 506); an analog control module (e.g., 516); a first interface with another IC die; and a second interface with DCUs in the IC die. The another IC die comprises PTR phases, the DCUs regulate corresponding load domains in the IC die, the mapping module maps the DCUs to the PTR phases using mapping information stored in the register, the digital control module regulates operations of the DCUs, and the analog control module regulates power to analog circuits in the IC die.

Example 20 provides the control circuit of Example 19, in which the mapping information comprises PDM configuration bits comprising identifying information about particular ones of the PTR phases mapped to particular ones of the DCUs, a number of DCUs and a number of PTR phases.

Example 21 provides the control circuit of any of Examples 19-20, in which a particular one of the PTR phases is mapped to one or more of the DCUs.

Example 22 provides the control circuit of any of Examples 19-21, in which at least one of the PTR phases is not mapped to any one of the DCUs.

Example 23 provides the control circuit of any of Examples 19-22, in which the PTR phases do not store identifying information about any of the DCUs to which they are mapped.

Example 24 provides the control circuit of any of Examples 19-23, wherein a particular one of the DCUs is mapped to one or more of the PTR phases.

Example 25 provides the control circuit of any of Examples 19-24, in which the DCUs do not store identifying information about any of the PTR phases to which they are mapped.

Example 26 provides the control circuit of any of Examples 19-25, in which all electrical coupling between the IC die and the another IC die is through the first interface.

Example 27 provides the control circuit of any of Examples 19-26, in which the first interface comprises: a first channel configured to communicate information common to circuits in the another IC die; and a second channel configured to communicate information specific to each of the PTR phases in the another IC die.

Example 28 provides the control circuit of any of Examples 19-27, in which the mapping module is configured to: receive per-domain information from the DCUs, convert the per-domain information to per-phase inputs using the mapping information, and send the per-phase inputs to a relevant one of the PTR phases in the another die over the first interface.

Example 29 provides the control circuit of Example 28, in which the per-domain information of a particular one of the DCUs comprises: PWM phased pulses; PTR phases to be enabled; operation mode of PTR phases needed by the corresponding load domain; and shutdown signals.

Example 30 provides the control circuit of any of Examples 28-29, in which the per-phase inputs to a particular one of the PTR phases comprises enable, operation mode, and shutdown signals relevant to the particular one of the PTR phases.

Example 31 provides the control circuit of any of Examples 19-30, in which the digital control module (e.g., 506) is configured to: receive per-phase information from the PTR phases, convert the per-phase information into per-domain inputs using the mapping information, and send the per-domain inputs to a relevant one of the DCUs over the second interface.

Example 32 provides the control circuit of Example 31, in which the per-domain inputs comprise: number of connected PTR phases; the relevant one of the DCUs to be enabled; and domain current information.

Example 33 provides the control circuit of any of Examples 19-32, in which the register is accessible to write commands and read commands.

Example 34 provides the control circuit of any of Examples 19-33, further comprising a module (e.g., 508) with functional and testing interfaces, wherein the functional interface is configured to couple to a CR bus and the testing interface comprises a JTAG/TAP.

Example 35 provides the control circuit of Example 34, in which the CR bus comprises a 32-bit register.

Example 36 provides the control circuit of any of Examples 34-35, further comprising a translating module (e.g., 510) configured to translate data received on the CR bus into an industry standard serial protocol, wherein the translated data is sent to the another die using the industry standard serial protocol.

Example 37 provides the control circuit of Example 36, in which the industry standard serial protocol is I2C.

Example 38 provides the control circuit of any of Examples 19-37, further comprising a current sensing circuit (e.g., 512) configured to: sum current from PTR phases mapped to DCUs according to the mapping information; and send the current sum information to the DCUs.

Example 39 provides the control circuit of Example 38, further comprising a current averaging circuit (e.g., 514) configured to perform a per-bump current averaging calculation for each active PTR phase based on the current sum information, wherein any of the active PTR phases may comprise more than one voltage bump circuit that lowers voltage from the first voltage to the second voltage.

Example 40 provides the control circuit of any of Examples 19-39, in which the analog control module comprises a LDO.

Example 41 provides a method (e.g., 1000 of FIG. 10), comprising: providing a first IC die having load domains (e.g., 1002); co-locating domain controllers in the first IC die (e.g., 1004); co-locating a powertrain die controller in the first IC die (e.g., 1006); providing a second IC die having powertrain phases (e.g., 1008); providing inductors in a package substrate (e.g., 1010); and coupling the domain controller, the powertrain die controller, the powertrain phases and the inductor in a package to generate a VR (e.g., 1012).

Example 42 provides the method of Example 41, in which the coupling comprises (e.g., 1100 of FIG. 11), at the powertrain die controller in the first IC die: receiving information about input voltage and powertrain phases from the second IC die (e.g., 1102); receiving information about the load domains from the domain controllers (e.g., 1104); mapping the domain controllers to particular ones of the powertrain phases (e.g., 1106); communicating per-domain information to the domain controllers (e.g., 1108); communicating per-phase information to the second IC die (e.g., 1110); and monitoring feedback information from the domain controllers and the second IC die (e.g., 1112).

Example 43 provides the method of Example 42, in which the mapping comprises writing values of powertrain PDM configuration bits in a register in the powertrain die controller.

Example 44 provides the method of any of Examples 42-43, in which the per-phase information of a particular one of the powertrain phases comprises enable, operation mode, and shutdown signals relevant to the particular one of the PTR phases.

Example 45 provides the method of any of Examples 42-44, in which monitoring feedback information from the second IC die comprises communicating data over industry standard serial protocol to a low voltage common block circuit in the second IC die.

Example 46 provides the method of any of Examples 42-45, in which monitoring feedback information comprises communicating reset and clock values to the second IC die.

Example 47 provides the method of any of Examples 42-46, in which the coupling further comprises, at the domain controller in the first IC die: converting digital VID code to analog voltage representing a desired voltage level at a particular load domain; generating a voltage error signal when the desired voltage level is different from actual voltage level measured at the particular load domain; generating PWM phased pulses for regulating powertrain phase drivers; processing current sensing information from the powertrain phases; and digitizing analog data for telemetry and debug.

Example 48 provides the method of any of Examples 41-47, further comprising coupling load domains into a ganged load domain sharing a common ganging current, and multiple powertrain dies having powertrain phases are coupled to the first IC die, individual ones of the powertrain die being controlled by a separate powertrain die controller in the first IC die.

Example 49 provides the method of any of Examples 41-48, in which the coupling comprises electrically connecting the first IC die, the second IC die and the inductors in the package with suitable interconnects.

Example 50 provides the method of Example 49, in which the interconnects comprise DTD interconnects between the first IC die and the second IC die, DTPS interconnects between the second IC die and the inductors in the package substrate, and copper pillars in an interposer between the first IC die and the inductors in the package substrate.

Example 51 provides the method of any of Examples 49-50, in which the interconnects comprise DTD interconnects between the first IC die and the second IC die, DTPS interconnects between the second IC die and the inductors in the package substrate, and TSVs in the second IC die between the first IC die and the inductors in the package substrate.

Example 52 provides the method of any of Examples 49-51, in which the interconnects comprise conductive vias and traces in a redistribution panel electrically coupling the first IC die and the second IC die, and DTPS interconnects between the redistribution panel and the package substrate.

Example 53 provides the method of any of Examples 49-52, in which the interconnects comprise DTPS interconnects between the first IC die and the package substrate and between the second IC die and the package substrate.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
a first integrated circuit (IC) die having one or more electrical load circuits, first control circuits, and a second control circuit;
a second IC die having one or more powertrain (PTR) phase circuits electrically coupled to the first IC die; and
one or more inductors in a package substrate electrically coupled to the first IC die and to the second IC die within a package, wherein:
the first IC die is coupled to a first side of the second IC die with die-to-die (DTD) interconnects,
the second IC die is coupled to the package substrate with die-to-package substrate (DTPS) interconnects on a second side opposite to the first side,
the first control circuits regulate power to corresponding electrical load circuits,
the second control circuit maps the first control circuits and the one or more PTR phase circuits,
the one or more PTR phase circuits control power to the one or more inductors, and
the first control circuits, the second control circuit, the one or more PTR phase circuits and the one or more inductors operate together as a voltage regulator (VR) configured to receive power from the package substrate at a first voltage and to deliver power to the electrical load circuits at a second voltage, the first voltage being higher than the second voltage.

2. The microelectronic assembly of claim 1, wherein the one or more PTR phase circuits are configured to operate at the first voltage.

3. The microelectronic assembly of claim 2, wherein the second IC die further comprises a common block circuit configured to operate at the second voltage.

4. The microelectronic assembly of claim 3, wherein the common block circuit in the second IC die is configured to:
generate signals when catastrophic faults are detected in the PTR phase circuits, and
send the signals to the second control circuit on the first IC die.

5. The microelectronic assembly of claim 1, wherein the second control circuit maps individual ones of the first control circuits to one or more of the PTR phase circuits.

6. The microelectronic assembly of claim 1, wherein:
the electrical load circuits are ganged together with a common ganging current, and
the corresponding first control circuits are connected together.

7. A microelectronic assembly, comprising:
a first integrated circuit (IC) die comprising electrical load circuits, first control circuits, and a second control circuit;
a second IC die conductively coupled with the first IC die, wherein the second IC die comprises one or more drive and power stage circuits; and
a package substrate conductively coupled with the first IC die and the second IC die, wherein the package substrate comprises one or more inductors, and wherein:
the first IC die is coupled to a first side of the second IC die with die-to-die (DTD) interconnects,
the second IC die is coupled to the package substrate with die-to-package substrate (DTPS) interconnects on a second side opposite to the first side,
the first control circuits regulate power to corresponding electrical load circuits, the second control circuit maps the first control circuits and the one or more drive and power stage circuits, the one or more drive and power stage circuits control power to the one or more inductors, and the first control circuits, the second control circuit, the one or more drive and power stage circuits, and the one or more inductors are to operate together as a voltage regulator (VR) configured to receive power from the package substrate at a first voltage and to deliver power to the electrical load circuits at a second voltage, wherein the first voltage is higher than the second voltage.

8. The microelectronic assembly of claim 7, further comprising:
one or more conductive pillars between the first IC die and the package substrate, wherein the one or more inductors are coupled with the first IC die via the one or more conductive pillars.

9. The microelectronic assembly of claim 8, further comprising:
a mold compound at least partially around the second IC die, wherein the one or more conductive pillars extend through the mold compound.

10. The microelectronic assembly of claim 8, further comprising:
an interposer, between the package substrate and the first IC die, wherein the one or more conductive pillars extend through the interposer.

11. The microelectronic assembly of claim 7, wherein:
the second IC die comprises one or more conductive vias between the package substrate and the first IC die, and
the one or more inductors are coupled with first IC die via the one or more conductive vias.

12. The microelectronic assembly of claim 7, wherein:
the one or more drive and power stage circuits are configured to operate at the first voltage.

13. The microelectronic assembly of claim 12, wherein:
the second IC die further comprises a circuit configured to operate at the second voltage.

14. The microelectronic assembly of claim 13, wherein the circuit configured to operate at the second voltage is to:
generate a signal in response to detection of a catastrophic fault in the one or more drive and power stage circuits, and
send the signal to the second control circuit.

15. The microelectronic assembly of claim 7, wherein the second control circuit is to map individual ones of the first control circuits to one or more of the drive and power stage circuits.

16. The microelectronic assembly of claim 7, wherein:
the electrical load circuits are ganged together with a common ganging current, and
corresponding first control circuits are connected together.

17. A microelectronic assembly, comprising:
a first integrated circuit (IC) die having one or more electrical load circuits, first control circuits, and a second control circuit;
a second IC die having one or more powertrain (PTR) phase circuits, wherein the second IC die is electrically coupled to the first IC die; and
one or more inductors in a package substrate electrically coupled to the first IC die and to the second IC die within a package, wherein:
the first control circuits regulate power to corresponding electrical load circuits,
the second control circuit maps the first control circuits and the one or more PTR phase circuits,
the one or more PTR phase circuits control power to the one or more inductors, and
the first control circuits, the second control circuit, the one or more PTR phase circuits and the one or more inductors operate together as a voltage regulator (VR) configured to receive power from the package substrate at a first voltage and to deliver power to the electrical load circuits at a second voltage, the first voltage being higher than the second voltage,
the one or more PTR phase circuits are configured to operate at the first voltage, and
the second IC die comprises a common block circuit configured to operate at the second voltage, wherein the common block circuit is to generate a signal in response to detection of a catastrophic fault in the one or more PTR phase circuits and send the signal to the second control circuit.

18. The microelectronic assembly of claim 17, wherein:
the first IC die is coupled to a first side of the second IC die with die-to-die (DTD) interconnects, and
the second IC die is coupled to the package substrate with die-to-package substrate (DTPS) interconnects on a second side opposite to the first side.

19. The microelectronic assembly of claim 17, wherein:
the first IC die is coplanar with the second IC die and conductively coupled with the second IC die through a semiconductor bridge in an interposer,
the first IC die and the second IC die are coupled to the semiconductor bridge with die-to-die (DTD) interconnects on a first side of the semiconductor bridge, and
the interposer is coupled to the package substrate with die-to-package substrate (DTPS) interconnects on a second side of the semiconductor bridge opposite to the first side.

20. The microelectronic assembly of claim 17, wherein:
the first IC die is coplanar with the second IC die, and conductively coupled with the second IC die through conductive traces and vias in the package substrate, and
the first IC die and the second IC die are coupled to the package substrate with die-to-package substrate (DTPS) interconnects.

* * * * *

UNITED STATES PATENT AND TRADEMARK OFFICE
CERTIFICATE OF CORRECTION

| | | |
|---|---|---|
| PATENT NO. | : 12,504,775 B2 | Page 1 of 1 |
| APPLICATION NO. | : 17/386912 | |
| DATED | : December 23, 2025 | |
| INVENTOR(S) | : Tamir Salus et al. | |

It is certified that error appears in the above-identified patent and that said Letters Patent is hereby corrected as shown below:

In the Claims

In Column 33, Claim 11, Line 33, delete "with first" and insert -- with the first --, therefor.

Signed and Sealed this
Tenth Day of February, 2026

John A. Squires
*Director of the United States Patent and Trademark Office*